(12) United States Patent
Wang et al.

(10) Patent No.: US 10,972,220 B2
(45) Date of Patent: Apr. 6, 2021

(54) INTERLEAVING METHOD AND APPARATUS

(71) Applicant: HUAWEI TECHNOLOGIES CO., LTD., Guangdong (CN)

(72) Inventors: Guijie Wang, Hangzhou (CN); Jian Wang, Hangzhou (CN); Yunfei Qiao, Hangzhou (CN); Yinggang Du, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/705,647

(22) Filed: Dec. 6, 2019

(65) Prior Publication Data
US 2020/0119846 A1    Apr. 16, 2020

Related U.S. Application Data

(63) Continuation of application No. PCT/CN2018/097782, filed on Jul. 31, 2018.

(30) Foreign Application Priority Data

Aug. 11, 2017 (CN) .......................... 201710687854.5
Aug. 16, 2017 (CN) .......................... 201710703557.5

(51) Int. Cl.
*H04L 1/00* (2006.01)

(52) U.S. Cl.
CPC .......... *H04L 1/0071* (2013.01); *H04L 1/0057* (2013.01)

(58) Field of Classification Search
CPC ....... H04L 1/00; H04L 1/0071; H04L 1/0013; H04L 1/0057; H03M 13/13; H03M 13/27; H03M 13/2707
See application file for complete search history.

(56) References Cited

U.S. PATENT DOCUMENTS

| 7,924,763 | B2 | 4/2011 | Nimbalker et al. |
| 9,564,927 | B2 | 2/2017 | Fonseka et al. |
| (Continued) | | | |

FOREIGN PATENT DOCUMENTS

| CN | 1917414 A | 2/2007 |
| CN | 101489135 A | 7/2009 |
| (Continued) | | |

OTHER PUBLICATIONS

Interleaver design for Polar code, 3GPP TSG RAN WG1 NR Ad-Hoc #2, R1-1709999, XP051305719, published on Jun. 27-30, 2017 (Year: 2017).*

(Continued)

*Primary Examiner* — Siu M Lee
(74) *Attorney, Agent, or Firm* — Fish & Richardson P.C.

(57) ABSTRACT

This application relates to the field of communications technologies, and discloses an interleaving method, a deinterleaving method, and an apparatus, to improve randomicity of polar code interleaving. The method is: obtaining a to-be-interleaved bit sequence, where the to-be-interleaved bit sequence includes L, subsequences, the L subsequences include S subsequence groups, the S subsequence groups include at least a first subsequence group and a second subsequence group, the first subsequence group includes at least two subsequences, the second subsequence group includes at least one subsequence, and L is a positive integer greater than 1; and interleaving the subsequences in the first subsequence group in a first interleaving manner, and skipping interleaving the subsequence in the second subsequence group or interleaving the subsequence in the second subsequence group in a second interleaving manner.

18 Claims, 9 Drawing Sheets

(56) References Cited

U.S. PATENT DOCUMENTS

| | | | | |
|---|---|---|---|---|
| 10,158,454 | B1* | 12/2018 | Nammi | H04B 7/0639 |
| 2003/0031233 | A1* | 2/2003 | Kim | H04L 1/0071 |
| | | | | 375/146 |
| 2008/0172593 | A1* | 7/2008 | Rainish | H03M 13/2742 |
| | | | | 714/776 |
| 2013/0272448 | A1* | 10/2013 | Moon | H04L 1/0071 |
| | | | | 375/298 |
| 2015/0089321 | A1* | 3/2015 | Myung | H03M 13/1165 |
| | | | | 714/758 |
| 2015/0121176 | A1 | 4/2015 | Myung et al. | |
| 2016/0021663 | A1* | 1/2016 | Takahashi | H04L 1/0071 |
| | | | | 370/329 |
| 2016/0044635 | A1* | 2/2016 | Seok | H04L 69/22 |
| | | | | 370/312 |
| 2016/0156432 | A1* | 6/2016 | Seo | H04L 1/0061 |
| | | | | 714/807 |
| 2019/0253299 | A1* | 8/2019 | Klenner | H04J 11/004 |
| 2020/0099471 | A1* | 3/2020 | Ye | H03M 13/13 |

FOREIGN PATENT DOCUMENTS

| | | |
|---|---|---|
| CN | 104935397 A | 9/2015 |
| CN | 105099622 A | 11/2015 |
| CN | 106972865 A | 7/2017 |
| CN | 107026709 A | 8/2017 |
| EP | 3073660 A1 | 9/2016 |
| WO | 2011159941 A1 | 12/2011 |

OTHER PUBLICATIONS

Rate matching for Polar code, 3GPP TSG RAN WG1 NR Ad-Hoc#2, R1-1711702, published on Jun. 27-30, 2017 (Year: 2017).*
CATT, "Interleaver design for NR polar codes," 3GPP TSG RAN WG1 Meeting #90, R1-1714570, XP051328112, Aug. 21-25, 2017, 4 pages.
Ericsson, "Channel Interleaver for Polar Codes," 3GPP TSG RAN WG1 Meeting #90, R1-1714691, XP051328242, Aug. 21-25, 2017, 28 pages.
Extended European Search Report issued in European Application No. 18844627.2 dated Jun. 23, 2020, 12 pages.
Huawei et al., "Interleaver design for Polar code," 3GPP TSG RAN WG1 NR Ad-Hoc #2, R1-1709999, XP051305719, Jun. 27-30, 2017, 4 pages.
Huawei, HiSilicon, "Rate matching for Polar code," 3GPP TSG RAN WG1 NR Ad-Hoc#2, R1-1711702, Qingdao, China, Jun. 27-30, 2017, 6 pages.
NTT Docomo, "Interleaving design of Polar codes," 3GPP TSG RAN WG1 NR Ad-Hoc#2, R1-1711128, Qingdao, China, Jun. 27-30, 2017, 6 pages.
PCT International Search Report and Written Opinion issued in International Application No. PCT/CN2018/097782 dated Sep. 13, 2018, 17 pages (with English translation).
Office Action issued in Indian Application No. 201937043700 dated Nov. 30, 2020, 6 pages.
Office Action issued in Chinese Application No. 201710703557.5 dated Jan. 26, 2021, 11 pages.

* cited by examiner

FIG. 4

INTERLEAVING METHOD AND APPARATUS

CROSS-REFERENCE TO RELATED APPLICATIONS

This application is a continuation of International Application No. PCT/CN2018/097782, filed on Jul. 31, 2018, which claims priority to Chinese Patent Application No. 201710703557.5, filed on Aug. 16, 2017 and Chinese Patent Application No. 201710687854.5, filed on Aug. 11, 2017. The disclosures of the aforementioned applications are hereby incorporated by reference in their entireties

TECHNICAL FIELD

Embodiments of this application relate to the field of communications technologies, and in particular, to an interleaving method and apparatus.

BACKGROUND

Rapid evolution of wireless communication indicates that a future 5th-generation (5th generation, 5G) communications system is to present some new features. Three most typical communication scenarios include enhanced mobile internet (enhance mobile broadband, eMBB), massive machine type communications (massive machine type communication, mMTC), and ultra-reliable and low-latency communications (ultra reliable low latency communication, URLLC). Requirements of the communication scenarios are to impose new challenges to an existing long term evolution (long term evolution, LTE) technology. As a most basic wireless access technology, channel encoding is one of important research objects meeting a 5G communication requirement. Currently, formulation of a 5G standard has been vigorously developed, and a polar code (Polar Codes) is also selected as a control channel encoding scheme. The polar code may also be referred to as a polar code, and is the first and only known channel encoding method that can be strictly proved to "reach" a channel capacity. For different code lengths, particularly for limited codes, performance of the polar code is much better than that of a turbo code and a low-density parity-check (low density parity check, LDPC) code. In addition, the polar code has relatively low computational complexity in terms of code encoding and decoding. These advantages enable the polar code to have a great development and application prospect in 5G.

To further improve anti-interference performance, an interleaving module is added into some channel encoding. On many compound channels on which both a random error and a burst error occur, for example, on a short-wave channel and a tropospheric scatter channel, one error usually affects a series of following data. Consequently, a burst error code is beyond an error correction capability of an error-correcting code, and the error correction capability is caused to decline. If first a burst error is discretized into a random error, and then the random error is corrected, the anti-interference performance of the system is to be further improved. During actual application, at a transmit end, an error correction encoder is followed by a digital interleaving unit, and at a receive end, deinterleaving is performed after demodulation. Under the action of an interleaving circuit and a deinterleaving circuit, a burst error channel is reconstructed into an independent random error channel. The burst error is expanded to implement error discretization, so that the burst error is distributed within an error correction range of the error correction encoder, to improve a channel error correction capability.

Currently, an interleaving design for the polar code achieves no ideal effect, and has much poorer performance than random interleaving.

SUMMARY

Embodiments of this application provide an interleaving method and apparatus, to improve randomicity of polar code interleaving.

According to a first aspect, an interleaving method is provided. A to-be-interleaved bit sequence is interleaved or grouped once, so that bits in a same group cover a relatively large range of the to-be-interleaved bit sequence, and then intra-group bits are interleaved. This can help avoid limitation of intra-group bit interleaving. In addition, different interleaving manners are used for intra-group interleaving in different groups. For example, if a row-column interleaving manner is used, when row quantities are fixed, different row quantities are used for the intra-group interleaving in the different groups, and when column quantities are fixed, different column quantities are used for the intra-group interleaving in the different groups, so that the interleaved sequence has more randomicity. It is found through experiment and simulation that, for a polar code, a more randomized effect achieved by performing an interleaving operation on the to-be-interleaved bit sequence indicates better performance of the polar code. Such an interleaving manner provided in this application can effectively reduce data regularity, and improve data randomicity, is more effective when applied to polar code interleaving, and is more helpful to improve encoding and decoding performance of the polar code.

In a possible design, the to-be-interleaved bit sequence is obtained. The to-be-interleaved bit sequence includes L subsequences. The L subsequences include S subsequence groups. The S subsequence groups include at least a first subsequence group and a second subsequence group. The first subsequence group includes at least two subsequences. The second subsequence group includes at least one subsequence. L is a positive integer greater than 1. The subsequences in the first subsequence group are interleaved in a first interleaving manner. Interleaving the subsequence in the second subsequence group is skipped or the subsequence in the second subsequence group is interleaved in a second interleaving manner. In different intra-group interleaving manners, data obtained through interleaving can be made more discretized and randomized, which is more helpful to improve performance of the polar code.

In a possible design, a result obtained by performing a modulo operation on a number of each subsequence in the first subsequence group based on a specified value is a first operation result; and a result obtained by performing a modulo operation on a number of each subsequence in the second subsequence group based on the specified value is a second operation result. The first operation result and the second operation result are different. For example, numbers are divided by the specified value to obtain remainders, and same remainders are in one group.

In a possible design, the first interleaving manner is first row-column interleaving, the second interleaving manner is second row-column interleaving, and row quantities or column quantities of the first row-column interleaving and the second row-column interleaving are different. In other words, interleaving manners having different interleave depths are used for the first subsequence group and the second subsequence group. In this way, parallel processing is easy on hardware implementation, addressing computation is relatively convenient, and the interleaved bit sequence has more randomicity and discreteness.

In a possible design, that the subsequences in the first subsequence group are interleaved in the first interleaving manner may be implemented in the following manner: inputting all bits in the first subsequence group into an interleaver one by one for row-column interleaving; or performing row-column interleaving on each of some or all of the subsequences in the first subsequence group within the subsequence.

In a possible design, that the subsequence in the second subsequence group is interleaved in the second interleaving manner may be implemented in the following manner: inputting all bits in the second subsequence group into an interleaver one by one for row-column interleaving; or performing row-column interleaving on each of some or all of the subsequences in the second subsequence group within the subsequence.

In a possible design, that the subsequences in the first subsequence group are interleaved in the first interleaving manner may be implemented in the following manner: interleaving locations of the subsequences in the first subsequence group; and inputting all bits in the first subsequence group into a row-column interleaver for row-column interleaving; or performing row-column interleaving on each subsequence in the first subsequence group within the subsequence.

In a possible design, that the subsequence in the second subsequence group is interleaved in the second interleaving manner may be implemented in the following manner: interleaving locations of subsequences in the second subsequence group; and inputting all bits in the second subsequence group into a row-column interleaver for row-column interleaving; or performing row-column interleaving on each subsequence in the second subsequence group within the subsequence.

In a possible design, after the to-be-interleaved bit sequence is obtained, before the subsequences in the first subsequence group are interleaved in the first interleaving manner, and interleaving the subsequence in the second subsequence group is skipped or the subsequence in the second subsequence group is interleaved in the second interleaving manner, the to-be-interleaved bit sequence is input into an i-row and j-column interleaver, and if i=L, and one row of bits constitute one subsequence, the subsequences in the first subsequence group are read row by row, and subsequences in the second subsequence group are read row by row; or if j=L, and one column of bits constitute one subsequence, the subsequences in the first subsequence group are read column by column, and subsequences in the second subsequence group are read column by column.

In a possible design, if i is known, j=[M /i], where M is a length of the to-be-interleaved bit sequence; or if j is known, i=[M/j], where M is a length of the to-be-interleaved bit sequence.

In a possible design, after the to-be-interleaved bit sequence is obtained, before the subsequences in the first subsequence group are interleaved in the first interleaving manner, and interleaving the subsequence in the second subsequence group is skipped or the subsequence in the second subsequence group is interleaved in the second interleaving manner, the L subsequences are grouped, to obtain the first subsequence group and the second subsequence group.

In a possible design, the S subsequence groups may be obtained in the following manner: performing a modulo-S operation on a number of each subsequence, where the modulo-S operation is performing a modulo operation on S, and S is a determined quantity of subsequence groups that needs to be obtained through division. Based on operation results, numbers having same operation results are in one group. For example, an operation result obtained by performing a modulo-S operation on the number of each subsequence in the first subsequence group is the first operation result, and an operation result obtained by performing a modulo-S operation on the number of each subsequence in the second subsequence group is the second operation result.

In a possible design, the S subsequence groups may be obtained in the following manner: performing a bit reversal order operation on numbers 1 to L of the subsequences, to obtain a new number order sequence, determining a quantity m of subsequences in one group based on an [L/S] or [L/S] operation and the determined quantity S of the subsequence groups, determining every m numbers in order in the obtained new number order sequence as one group, and determining subsequences in each group based on numbers in each group. A quantity of the last group of subsequences may be less than or equal to m. Optionally, if L is not an integral power of 2, the number order sequence obtained by performing the bit reversal order operation on the numbers 1 to L of the subsequences includes a value greater than L. The sequence obtained by performing the bit reversal order operation is rearranged in order, to obtain a location sequence. The foregoing group selecting procedure continues to be performed based on the location sequence.

In a possible design, the S subsequence groups may be obtained in the following manner: selecting numbers from 1 to L at fixed intervals of G, to obtain the first group of numbers, and removing the first group of numbers from the numbers 1 to L; similarly, then selecting numbers from remaining numbers at the fixed intervals of G, to obtain the second group of numbers, and removing the second group of numbers; and by such analogy, performing an operation similar to the foregoing description until the last group of numbers are selected.

In a possible design, the S subsequence groups may be obtained in the following manner: operating numbers 1 to L of the subsequences in Manner 3, obtaining a new number order sequence based on selected numbers of groups, determining a quantity m of subsequences in one group based on an [L/S] or [L/S] operation and the determined quantity S of the subsequence groups, determining every m numbers in order in the obtained new number order sequence as one group, and determining subsequences in each group based on numbers in each group. A quantity of the last group of subsequences may be less than or equal to m. Optionally, if L is not an integral power of 2, a number order sequence obtained by performing a bit reversal order operation on the numbers 1 to L of the subsequences includes a value greater than L. The sequence obtained by performing the bit reversal order operation is rearranged in order, to obtain a location sequence, The foregoing group selecting procedure continues to be performed based on the location sequence.

In a possible design, the S subsequence groups may be obtained in the following manner: selecting a smallest value, a largest value, and an intermediate value from numbers 1 to L of the subsequences as the first group of numbers, where the intermediate value is obtained by rounding up or rounding down a value obtained by dividing the largest value in a number order sequence by 2, and removing the first group of numbers from the numbers 1 to L; similarly, continuing to select a smallest value, a largest value, and an intermediate value from remaining numbers as the second group of numbers, and removing the second group of numbers; and by such analogy, performing an operation similar to the foregoing description until the last group of numbers are selected.

In a possible design, the S subsequence groups may be obtained in the following manner: operating numbers 1 to L of the subsequences in Manner 5, obtaining a new number order sequence based on selected numbers of groups, determining a quantity m of subsequences in one group based on an [L/S] or [L/S] operation and the determined quantity S of the subsequence groups, determining every m numbers in order in the obtained new number order sequence as one group, and determining subsequences in each group based on numbers in each group. A quantity of the last group of subsequences may be less than or equal to m. Optionally, if L is not an integral power of 2, a number order sequence obtained by performing a bit reversal order operation on the numbers 1 to L of the subsequences includes a value greater than L. The sequence obtained by performing the bit reversal order operation is rearranged in order, to obtain a location sequence. The foregoing group selecting procedure continues to be performed based on the location sequence.

In a possible design, the quantity L of the subsequences and the quantity S of the subsequence groups may be determined by a combination of at least several factors. For example, first, the quantity L of the subsequences and the quantity S of the subsequence groups may be associated with a modulation order, and the quantity S of the subsequence groups is a function form of the modulation order; second, the quantity L of the subsequences and the quantity S of the subsequence groups may also be associated with actual hardware implementation, in the actual hardware implementation, S is a power of 2, and operation is relatively easy; and third, the quantity L of the subsequences and the quantity S of the subsequence groups may also be associated with being randomized as much as possible, and S is a prime number as much as possible.

In a possible design, a value of L is any one of the following: 16, 31, 32, 64, 7, 11, 13, 19, 23, 29, 37, and 61.

In a possible design, locations of the first subsequence group and the second subsequence group are interleaved.

According to a second aspect, an interleaving apparatus is provided. The apparatus has a function of implementing the method according to any one of the first aspect and the possible designs of the first aspect. The function may be implemented by hardware, or may be implemented by hardware executing corresponding software. The hardware or software includes one or more modules corresponding to the foregoing function.

In a possible design, when a part or all of the function is implemented by using the hardware, the interleaving apparatus includes: an input interface circuit, configured to obtain the to-be-interleaved bit sequence; a logic circuit, configured to perform the behavior according to any one of the first aspect and the possible designs of the first aspect; and an output interface circuit, configured to output the interleaved bit sequence.

Optionally, the interleaving apparatus may be a chip or an integrated circuit.

In a possible design, when a part or all of the function is implemented by using the software, the interleaving apparatus includes: a memory, configured to store a program; and a processor, configured to execute the program stored in the memory, where when the program is executed, the interleaving apparatus may implement the method according to any one of the first aspect and the possible designs of the first aspect.

Optionally, the memory may be a physically independent unit, or may be integrated with the processor.

In a possible design, when a part or all of the function is implemented by using the software, the interleaving apparatus includes a processor. A memory configured to store a program is located outside the interleaving apparatus. The processor is connected to the memory through a circuit/wire, and is configured to read and execute the program stored in the memory.

According to a third aspect, a communications system is provided. The communications system includes a transmit end and a receive end. The transmit end may perform the method according to the first aspect and the possible designs of the first aspect.

According to a fourth aspect, a computer storage medium is provided. The computer storage medium stores a computer program. The computer program includes an instruction used to perform the method according to any one of the first aspect and the possible designs of the first aspect.

According to a fifth aspect, an embodiment of this application provides a computer program product including an instruction. When the computer program product is run on a computer, the computer is enabled to perform the method according to the foregoing aspects.

BRIEF DESCRIPTION OF DRAWINGS

FIG. 4 is a schematic diagram of a subsequence group obtaining method according to an embodiment of this application;

DESCRIPTION OF EMBODIMENTS

Figure 1A:
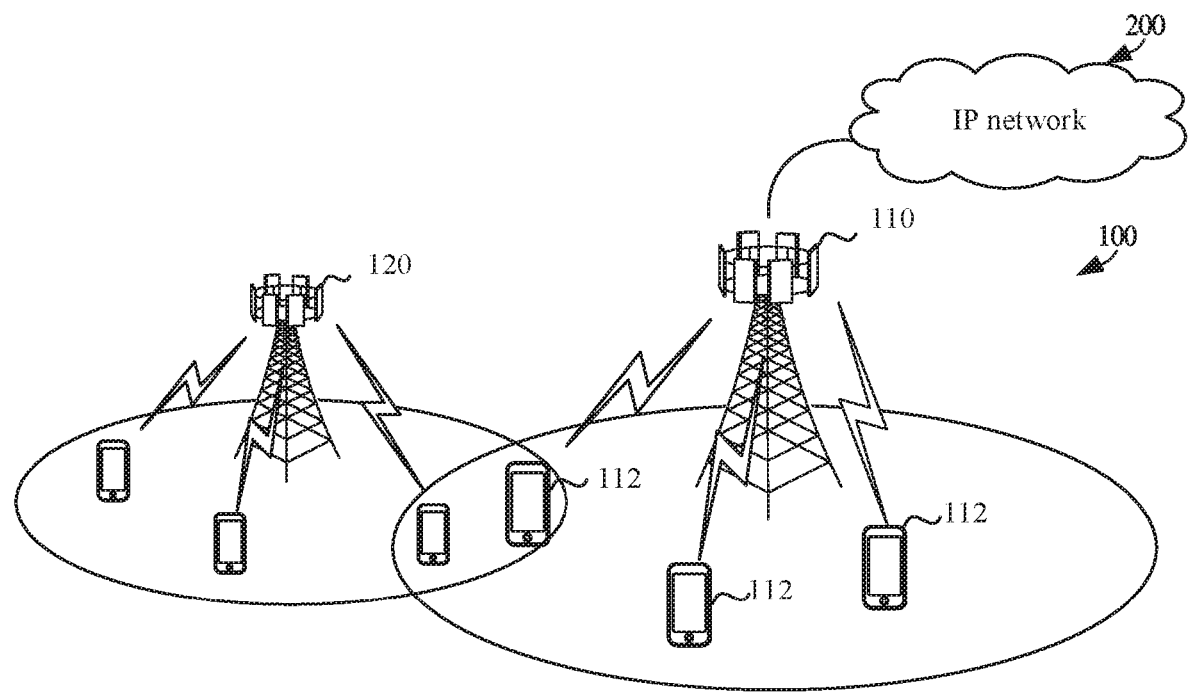
FIG. 1(a) and FIG. 1(b) are schematic architectural diagrams of an applied communications system according to an embodiment of this application.

The following describes in detail the embodiments of this application with reference to accompanying drawings.

The embodiments of this application provide an interleaving method and apparatus. A to-be-interleaved bit sequence is interleaved or grouped once, so that bits in a same group cover a relatively large range of the to-be-interleaved bit sequence, and then the bits in the group are interleaved. This can help avoid limitation of intra-group bit interleaving. In addition, different interleaving manners are used for intra-group interleaving in different groups. For example, if a row-column interleaving manner is used, when row quantities are fixed, different row quantities are used for the intra-group interleaving in the different groups, and when column quantities are fixed, different column quantities are used for the intra-group interleaving in the different groups, so that the interleaved sequence has more randomicity. It is found through experiment and simulation that, for a polar code, a more randomized effect achieved by performing an interleaving operation on the to-be-interleaved bit sequence indicates better performance of the polar code. Such an interleaving manner provided in this application can effectively reduce data regularity, and improve data randomicity, is more effective when applied to polar code interleaving, and is more helpful to improve encoding and decoding performance of the polar code.

For convenience of understanding of the embodiments of this application, the polar code is briefly described below.

In an encoding scheme of the polar code, a noise-free channel is used to transmit information useful for a user, and a pure noisy channel is used to transmit agreed information or does not transmit information. The polar code is also a linear block code. An encoding matrix of the polar code is $G_N$. An encoding process is $x_1^N = u_1^N G_N \cdot u_1^N = (u_1, u_2, \ldots, u_N)$ is a binary row vector, and has a length of N (namely, a code length). $G_N$ is an N×N matrix, and $G_N = F_2^{\otimes (\log_2(N))}$. $F_2^{\otimes (\log_2(N))}$ is defined, as a Kronecker (Kronecker) product of $\log_2 N$ matrices $F_2$. The foregoing matrix $$F_2 = \begin{bmatrix} 1 & 0 \\ 1 & 1 \end{bmatrix}.$$

In the encoding process of the polar code, some bits in $u_1^N$ are used to carry information, and are referred to as an information bit set. A set of indexes of the bits is denoted by A. The other bits are set to fixed values pre-agreed by a receive end and a transmit end, and are referred to as a fixed bit set or a frozen bit set (frozen bits). A set of indexes of the bits is represented by a complementary set $A^C$ of A. The encoding process of the polar code is equivalent to: $x_1^N = u_A G_N(A) \oplus u_{A^C} G_N(A^C)$. Herein, $G_N(A)$ is a submatrix obtained by using rows corresponding to the indexes in the set A in $G_N$, and $G_N(A^C)$ is a submatrix obtained by using rows corresponding to the indexes in the set $A^C$ in $G_N$. $u_A$ is the information bit set in $u_1^N$, and a quantity of information bits is K. $u_{A^C}$ is the fixed bit set in $u_1^N$, a quantity of fixed bits is (N-K), and the fixed bits are known bits. The fixed bits are usually set to 0. However, the fixed bits may be arbitrarily set, provided that the fixed bits are pre-agreed by the receive end and the transmit end. In this way, an encoded output of the polar code may be simplified as $x_1^N = u_A G_N(A)$. Herein, $u_A$ is the information bit set in $u_1^N$, and $u_A$ is a row vector having a length of K. In other words, $|A|=K|\cdot|$ represents a quantity of elements in a set, K is a size of an information block, $G_N(A)$ is the submatrix obtained by using the rows corresponding to the indexes in the set A in the matrix $G_N$, and $G_N(A)$ is a K×N matrix.

A construction process of the polar code is a selection process of the set A, and determines performance of the polar code. The construction process of the polar code is usually: determining, based on a code length N of a mother code, that there are N polarized channels in total that respectively correspond to N rows of the encoding matrix, calculating reliability of the polarized channels, using indexes of first K polarized channels having relatively high reliability as elements in the set A, and using indexes corresponding to remaining (N-K) polarized channels as elements in the set $A^C$ of the indexes of the fixed bits. The set A determines locations of the information bits, and the set $A^C$ determines locations of the fixed bits.

As shown in FIG. 1(a), a communications system 100 includes a network device 110 and a terminal 112. When the wireless communications network 100 includes a core network, the network device 110 may further be connected to the core network. The network device 101 may further communicate with an IP network 200 such as the Internet (internet), a private IP network, or another data network. A network device provides a service to a terminal within coverage. For example, referring to FIG. 1(a), the network device 110 provides wireless access to one or more terminals within coverage of the network device 110. In addition, an overlapping area may exist within coverage between network devices, for example, the network device 110 and a network device 120. The network devices may further communicate with each other. For example, the network device 110 may communicate with the network device 120.

Figure 1B:
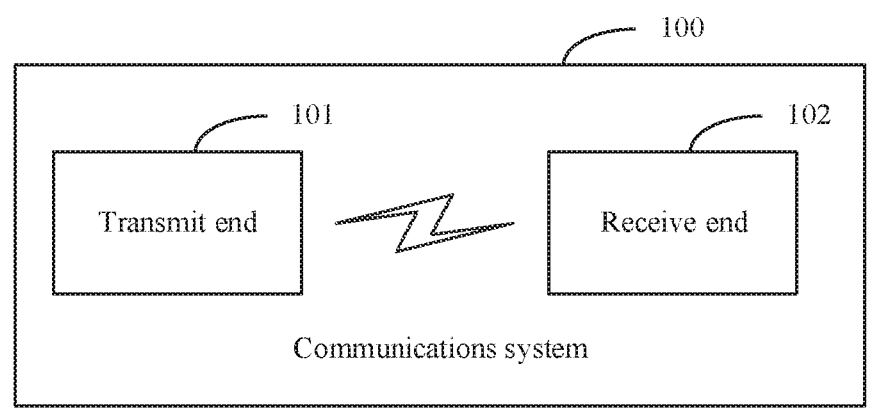

When the network device 110 or the terminal 112 sends information or data, an interleaving method described in the embodiments of this application may be used. Therefore, for convenience of description, in the embodiments of this application, the communications system 100 is simplified to a system that includes a transmit end 101 and a receive end 102 and that is shown in FIG. 1(b). The transmit end 101 may be the network device 110, and the receive end 102 is the terminal 112; or the transmit end 101 is the terminal 112, and the receive end 102 is the network device 110. The network device 110 may be a device configured to communicate with the terminal device. For example, the network device 110 may be a base transceiver station (Base Transceiver Station, BTS) in a GSM system or a CDMA system, or may be a NodeB (NodeB, NB) in a WCDMA system, or may be an evolved NodeB (Evolved NodeB, eNB, or eNodeB) in an LTE system, a network side device in a future 5G network, or the like. Alternatively, the network device may further be a relay station, an access point, a vehicle-mounted device, or the like. In a device to device (Device to Device, D2D) communications system, the network device may alternatively be a terminal functioning as a base station. The terminal may include various handheld devices, vehicle-mounted devices, wearable devices, or computing devices having a wireless communication function, or other processing devices connected to a wireless modem, and various forms of user equipments (user equipment, UE), mobile stations (mobile station, MS), and the like.

An encoding procedure in this application is approximately: performing polar code encoding on to-be-encoded information, performing, based on a target code length M, rate matching on encoded bits on Which the polar code encoding is performed, interleaving a bit sequence on which the rate matching is performed, and outputting the interleaved bit sequence.

The embodiments of this application relate to interleaving steps. Certainly, the to-be-interleaved bit sequence may be the bit sequence on which the rate matching is performed in the foregoing procedure. In another possible implementation, the to-be-interleaved bit sequence may alternatively be encoded bits on which the rate matching is not performed. Description is provided in this application by using an example in which the to-be-interleaved bit sequence may be the bit sequence on which the rate matching is performed in the foregoing procedure. A length of the bit sequence on which the rate matching is performed is the target code length M, where M is an integral power of 2.

An interleaver is used in the solutions designed in the embodiments of this application. For convenience of understanding of subsequent content, the interleaver is briefly described below.

Figure 2:
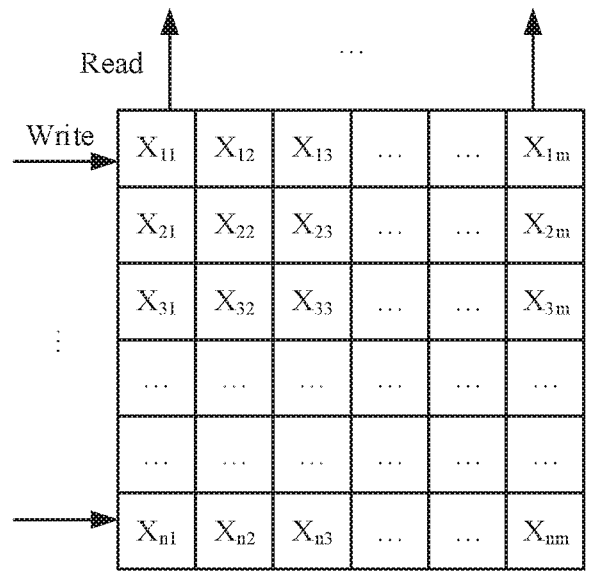
FIG. 2 is a schematic diagram of a row-in and column-out operation of a row-column interleaver according to an embodiment of this application.

Bits interleaved by using the interleaver are referred to as to-be-interleaved bits. The to-be-interleaved bits are written into the interleaver, and then read from the interleaver. A sequence of read bits changes compared with a sequence of written bits, so that an interleaving effect is achieved. A method for writing bits into and reading bits from the interleaver may be a row-in and column-out manner, a column-in and row-out manner, a column-in and column-out manner, a row-in and zigzag-column-out manner, a column-in and zigzag-column-out manner, or the like. The writing and reading manners are the prior art. Details are not described herein again. When bits are written into the interleaver, a row quantity may be first fixed, and a column quantity, to be specific, a quantity of bits included in each row, is calculated; or a column quantity may be first fixed, and a row quantity, to be specific, a quantity of bits included in each column, is calculated. If the row quantity is fixed to i, the column quantity is obtained by rounding up a value obtained by dividing a total length of the bits for row-column interleaving by i; or if the column quantity is fixed to j, the row quantity is obtained by rounding up a value obtained by dividing a total length of the bits for row-column interleaving by j. When the bits are written into the interleaver by rows, the to-be-interleaved bits are input into the interleaver row by row, a quantity of bits input in each row is the column quantity calculated by using the foregoing method, and if bits input in the last row are insufficient, a null bit is used as a complement; or when the bits are written into the interleaver by columns, the to-be-interleaved bits are input into the interleaver column by column, a quantity of bits input in each column is the row quantity calculated by using the foregoing method, and if bits input in the last column are insufficient, a null bit is used as a complement. If the null bit is used for filling, the null bit needs to be deleted after interleaving. In addition, the concept of "interleave depth" used in the embodiments of this application is explained. If the row quantity is first fixed, the interleave depth refers to a value of the row quantity; or if the column quantity is first fixed, the interleave depth refers to a value of the column quantity. The row-in and column-out manner is used as an example. As shown in FIG. 2, a matrix of m×n dimensions is generated based on the to-be-interleaved bits, a row-in and column-out operation is performed on the to-be-interleaved bits based on rows and columns of the matrix, a data input order is $[X_{11}, X_{12}, X_{13}, \ldots, X_{1m}, X_{21}, X_{23}, \ldots X_{2m}, \ldots, X_{n1}, X_{n2}, \ldots, X_{nm}]$, and a data output order is $[X_{11}, X_{21}, X_{31}, \ldots, X_{n1}, X_{12}, X_{22}, X_{32}, \ldots,$ $X_{n2}, \ldots, X_{1m}, X_{2m}, X_{3m}, X_{nm}]$. $X_{11}$ indicates a bit in the first row and the first column in the interleaver. If the row quantity is first fixed, the interleave depth is m; or if the column quantity is first fixed, the interleave depth is n.

Figure 3:
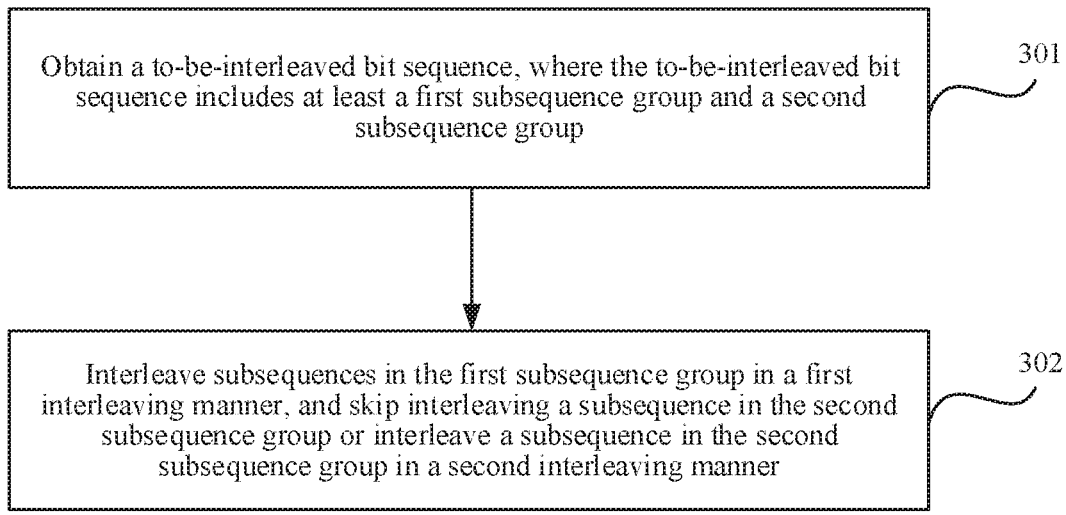
FIG. 3 is a schematic flowchart of an interleaving method according to an embodiment of this application.

Based on an architecture of the communications system shown in FIG. 1(a), in the embodiments of this application, the interleaving method may be performed by the transmit end 101. As shown in FIG. 3, an interleaving method provided in an embodiment of this application has the following specific procedures.

Step 301: Obtain a to-be-interleaved bit sequence.

The to-be-interleaved bit sequence includes L subsequences, Optionally, the L subsequences are consecutive subsequences obtained by dividing the to-be-interleaved bit sequence. Any two subsequences do not intersect. The L subsequences include S subsequence groups. One subsequence group includes at least one subsequence, but at least one subsequence group includes more than one subsequence. L and S are both positive integers greater than 1. For convenience of description, it is assumed that any two subsequence groups included in the S subsequence groups are respectively denoted as a first subsequence group and a second subsequence group. It may be considered that the first subsequence group includes at least two subsequences, and the second subsequence group includes at least one subsequence.

Step 302: Interleave the subsequences in the first subsequence group in a first interleaving manner, and skip interleaving the subsequence in the second subsequence group or interleave the subsequence in the second subsequence group in a second interleaving manner.

Specifically, intra-group interleaving is performed on some or all of the S subsequence groups. An interleaving manner of the intra-group interleaving may be, but is not limited to, row-column interleaving by using an interleaver.

The first interleaving manner and the second interleaving manner are different interleaving manners, and are aimed at implementing randomization and discretization of groups of bits, thereby implementing randomization and discretization of the to-be-interleaved bit sequence. The first interleaving manner and the second interleaving manner may be understood as different methods for writing into and reading on the row-column interleaver, or may be understood as using different interleave depths or using row-column, interleaving of different row quantities or different column quantities when using a same method for writing into and reading on the row-column interleaver. For example, if the first interleaving manner and the second interleaving manner are both row-column interleaving performed by using the interleaver, the first interleaving manner is denoted as first row-column interleaving, the second interleaving manner is denoted as second row-column interleaving, and the first interleaving manner and the second interleaving manner are both row-in and column-out manners. If row quantities are first fixed, the row quantities fixed in the first interleaving manner and the second interleaving manner are different. For example, in the first interleaving manner, a row quantity is fixed to 3, and in the second interleaving manner, a row quantity is fixed to 5. If column quantities are first fixed, the column quantities fixed in the first interleaving manner and the second interleaving manner are different. For example, in the first interleaving manner, a column quantity is fixed to 3, and in the second interleaving manner, a column quantity is fixed to 5.

Any two of the S subsequence groups that execute intra-group interleaving use different interleave depths. In this way, interleaved bit sequences have more randomicity and discreteness.

In this embodiment of this application, a row-column interleaving manner is used for intra-group interleaving of the subsequence groups, parallel processing is easy on hardware implementation, and addressing computation is relatively convenient.

The subsequence group may include two or more subsequences. In this case, when intra-group interleaving is implemented in this embodiment of this application, more different processing manners may further be used. For any subsequence group on which intra-group interleaving is performed, manners of intra-group interleaving may be, but are not limited to, the following several manners.

Manner 1: All bits of the sequence group are used as a whole to perform row-column interleaving by using the interleaver.

Manner 2: Row-column interleaving is performed on each of at least one subsequence in the subsequence group within the subsequence, where bits in one subsequence are input into the interleaver for interleaving. Optionally, row-column interleaving is performed on each subsequence in the subsequence group within the subsequence, and locations of the interleaved subsequences are arranged in order.

Manner 3: Locations of the subsequences in the subsequence group are interleaved, and then all bits in the subsequence group are used as a whole to perform row-column interleaving by using the interleaver in Manner 1.

Manner 4: Locations of the subsequences in the subsequence group are interleaved, and then row-column interleaving is performed on each of at least one subsequence in the subsequence group within the subsequence in Manner 2.

Manner 5: First, row-column interleaving is performed on each of at least one subsequence in the subsequence group within the subsequence, and then locations of the interleaved subsequences are interleaved.

The row-column interleaving in Manner 1 to Manner 5 may alternatively be replaced with any other interleaving manner.

Optionally, before or after intra-group interleaving is performed on the subsequence groups, locations of the subsequence groups may further be interleaved, to be specific, the locations of the subsequence groups are arranged out of order. For example, S=5, numbers of the subsequence groups are 1 to 5, before interleaving, an order of the locations of the subsequence groups are 1, 2, 3, 4, 5, and after interleaving, an order of the locations of the subsequence groups are 3, 5, 4, 2, 1.

The intra-group interleaving manner of the subsequence groups is described. In this embodiment of this application, the to-be-interleaved bit sequence may be grouped, to obtain the S subsequence groups. Alternatively, the to-be-interleaved bit sequence may be input into the interleaver, one row or one column is used as one subsequence, and subsequences are output in row order that is after grouping or in column order that is after grouping, to obtain the S subsequence groups.

How to obtain the S subsequence groups is specifically described below. In this embodiment of this application, the S subsequence groups may be obtained by using, but is not limited to, the following several manners.

It is assumed that numbers of the L subsequences is 1, 2, . . . , L, and a number order sequence [1, 2, . . . , L] is constituted.

Manner 1: A modulo-S operation is performed on a number of each subsequence, where the modulo-S operation is performing a modulo operation on S, and S is a determined quantity of subsequence groups that needs to be obtained through division. Based on operation results, numbers having same operation results are in one group. For example, an operation result obtained by performing a modulo-S operation on a number of each subsequence in the first subsequence group is a first operation result, and an operation result obtained by performing a modulo-S operation on a number of each subsequence in the second subsequence group is a second operation result.

Manner 2: A bit reversal order operation is performed on numbers 1 to L of the subsequences, to obtain a new number order sequence, a quantity m of subsequences in one group is determined based on an [L/S] or [L/S] operation and the determined quantity S of the subsequence groups, every m numbers in order are determined in the obtained new number order sequence as one group, and subsequences in each group are determined based on numbers in each group. A quantity of the last group of subsequences may be less than or equal to m.

In a possible case, if L is not an integral power of 2, the number order sequence obtained by performing the bit reversal order operation on the numbers 1 to L of the subsequences includes a value greater than L. The sequence obtained by performing the bit reversal order operation is rearranged in order, to obtain a location sequence. The foregoing group selecting procedure continues to be performed based on the location sequence.

Manner 3: Numbers are selected from 1 to L at fixed intervals of G, to obtain the first group of numbers, and the first group of numbers are removed from the numbers 1 to L; similarly, numbers are then selected from remaining numbers at the fixed intervals of G, to obtain the second group of numbers, and the second group of numbers are removed; and by such analogy, an operation similar to the foregoing description is performed until the last group of numbers are selected.

Manner 4: Numbers 1 to L of the subsequences are operated in Manner 3, a new number order sequence is obtained based on selected numbers of groups, a quantity m of subsequences in one group is determined based on an [L/S] or [L/S] operation and the determined quantity S of the subsequence groups, every m numbers in order are determined in the obtained new number order sequence as one group, and subsequences in each group are determined based on numbers in each group. A quantity of the last group of subsequences may be less than or equal to m.

In a possible case, if L is not an integral power of 2, a number order sequence obtained by performing a bit reversal order operation on the numbers 1 to L of the subsequences includes a value greater than L. The sequence obtained by performing the bit reversal order operation is rearranged in order, to obtain a location sequence. The foregoing group selecting procedure continues to be performed based on the location sequence.

Manner 5: A smallest value, a largest value, and an intermediate value are selected from numbers 1 to L of the subsequences as the first group of numbers, where the intermediate value is obtained by rounding up or rounding down a value obtained by dividing the largest value in a number order sequence by 2, and the first group of numbers are removed from the numbers 1 to L; similarly, a smallest value, a largest value, and an intermediate value continue to be selected from remaining numbers as the second group of numbers, and the second group of numbers are removed; and by such analogy, an operation similar to the foregoing description is performed until the last group of numbers are selected.

Manner 6: Numbers 1 to L of the subsequences are operated in Manner 5, a new number order sequence is obtained based on selected numbers of groups, a quantity m of subsequences in one group is determined based on an [L/S] or [L/S] operation and the determined quantity S of the subsequence groups, every m numbers in order are determined in the obtained new number order sequence as one group, and subsequences in each group are determined based on numbers in each group. A quantity of the last group of subsequences may be less than or equal to m.

In a possible case, if L is not an integral power of 2, a number order sequence obtained by performing a bit reversal order operation on the numbers 1 to L of the subsequences includes a value greater than L. The sequence obtained by performing the bit reversal order operation is rearranged in order, to obtain a location sequence. The foregoing group selecting procedure continues to be performed based on the location sequence.

Optionally, during actual application, after the to-be-interleaved bit sequence is obtained, the to-be-interleaved bit sequence may be divided into the L subsequences in order, or the to-be-interleaved bit sequence may be input into the interleaver, to output L rows or L columns, where one row or one column is a subsequence. The L subsequences are grouped in any one of Manner 1 to Manner 6, to obtaining the S subsequence groups.

Optionally, during actual application, alternatively, after the to-be-interleaved bit sequence is obtained, the to-be-interleaved bit sequence may be input into the interleaver, to output subsequences in order after rearranging rows or columns based on the subsequence order obtained in any one of Manner 1 to Manner 6, or to output subsequences row by row or column by column based on the subsequence order obtained in any one of Manner 1 to Manner 6. For example, M is a length of the to-be-interleaved bit sequence, and the to-be-interleaved bit sequence is input into an i-row and j-column interleaver. If i=L, bits in one row form a subsequence, a column quantity j=[M/i], and subsequences in each subsequence group are read row by row, for example, the subsequences in the first subsequence group are read row by row, and subsequences in the second subsequence group are read row by row; or j=L, a row quantity i=[M/j], one column of bits constitute one subsequence, and subsequences in each subsequence group are read column by column, for example, the subsequences in the first subsequence group are read column by column, and subsequences in the second subsequence group are read column by column.

Some specific examples are provided below for Manner 1 to Manner 6.

It is assumed that L=32, and subsequence groups are obtained in Manner 2. First, a bit reversal order operation is performed on [1 to 32], to obtain a sequence [1, 17, 9, 25, 5, 21, 13, 29, 3, 19, 11, 27, 7, 23, 15, 31, 2, 18, 10, 26, 6, 22, 14, 30, 4, 20, 12, 28, 8, 24, 16, 32]. If S=4, and 32/4=8, numbers may be selected from the sequence in order, every eight numbers are selected to obtain a group of data, and obtained subsequence groups are [1, 17, 9, 25, 5, 21, 13, 29], [3, 19, 11, 27, 7, 23, 15, 31], [2, 18, 10, 26, 6, 22, 14, 30], and [4, 20, 12, 28, 8, 24, 16, 32]. If S=5, based on [32/5], a quantity of subsequences included in each group is 6, and last two redundant subsequences may be placed in any one or two groups. Herein, assuming that the redundant two subsequences are placed in the last group, obtained subsequence groups are as follows: The first group is [1, 17, 9, 25, 5, 21], the second group is [13, 29, 3, 19, 11, 27], the third group is [7, 23, 15, 31, 2, 18], the fourth group is [10, 26, 6, 22, 14, 30], and the fifth group of data is [4, 20, 12, 28, 8, 24, 16, 32]. If S=5, based on [32/5], a quantity of subsequences included in each group is 7, last four redundant subsequences may be placed in any at least one group. Herein, assuming that the last four redundant subsequences are placed in the last group, a quantity of subsequences included in each of first four groups is 7, a quantity of subsequences included in the last group is 4, and obtained subsequence groups are: [1, 17, 9, 25, 5, 21, 13], [29, 3, 19, 11, 27, 7, 23], [15, 31, 2, 18, 10, 26, 6], [22, 14, 30, 4, 20, 12, 28], and [8, 24, 16, 32].

In the foregoing example, the value 32 is operated. 32 is a power of 2. Therefore, 32 values may be easily obtained in bit reversal order. If a value does not satisfy a power of 2, a value greater than L in a generated sequence is removed based on the bit reversal order operation, then the sequence is rearranged in order, to obtain a new sequence, and an operation of grouping is performed based on the new sequence. For example, L=14, a bit reversal order operation is performed on [1 to 14], and an obtained sequence is: q=[1, 9, 5, 13, 3, 11, 7, 15, 2, 10, 6, 14, 4, 12]. For the sequence q, a location sequence obtained by being arranged in descending order is: $s_1$=[8, 12, 4, 14, 6, 10, 2, 7, 11, 3, 13, 5, 9, 1], and a location sequence obtained by being arranged in ascending order is: $s_2$=[1, 9, 5, 13, 3, 11, 7, 2, 10, 6, 14, 4, 12, 8]. Subsequently, grouping is determined based on the sequence $s_1$ or the sequence $s_2$. Assuming that a quantity of groups is 2, based on the order of $s_1$, the first subsequence group is [8, 12, 4, 14, 6, 10, 2], and the second subsequence group is [7, 11, 3, 13, 5, 9, 1].

It is assumed that L=31, and subsequence groups are obtained in Manner 2. First, a bit reversal order operation is performed on [1 to 31], to obtain a sequence [1, 17, 9, 25, 5, 21, 13, 29, 3, 19, 11, 27, 7, 23, 15, 31, 2, 18, 10, 26, 6, 22, 14, 30, 4, 20, 12, 28, 8, 24]. Grouping is performed based on the obtained sequence. A group manner is similar to that when L=32. Details are not described herein again.

Figure 4:
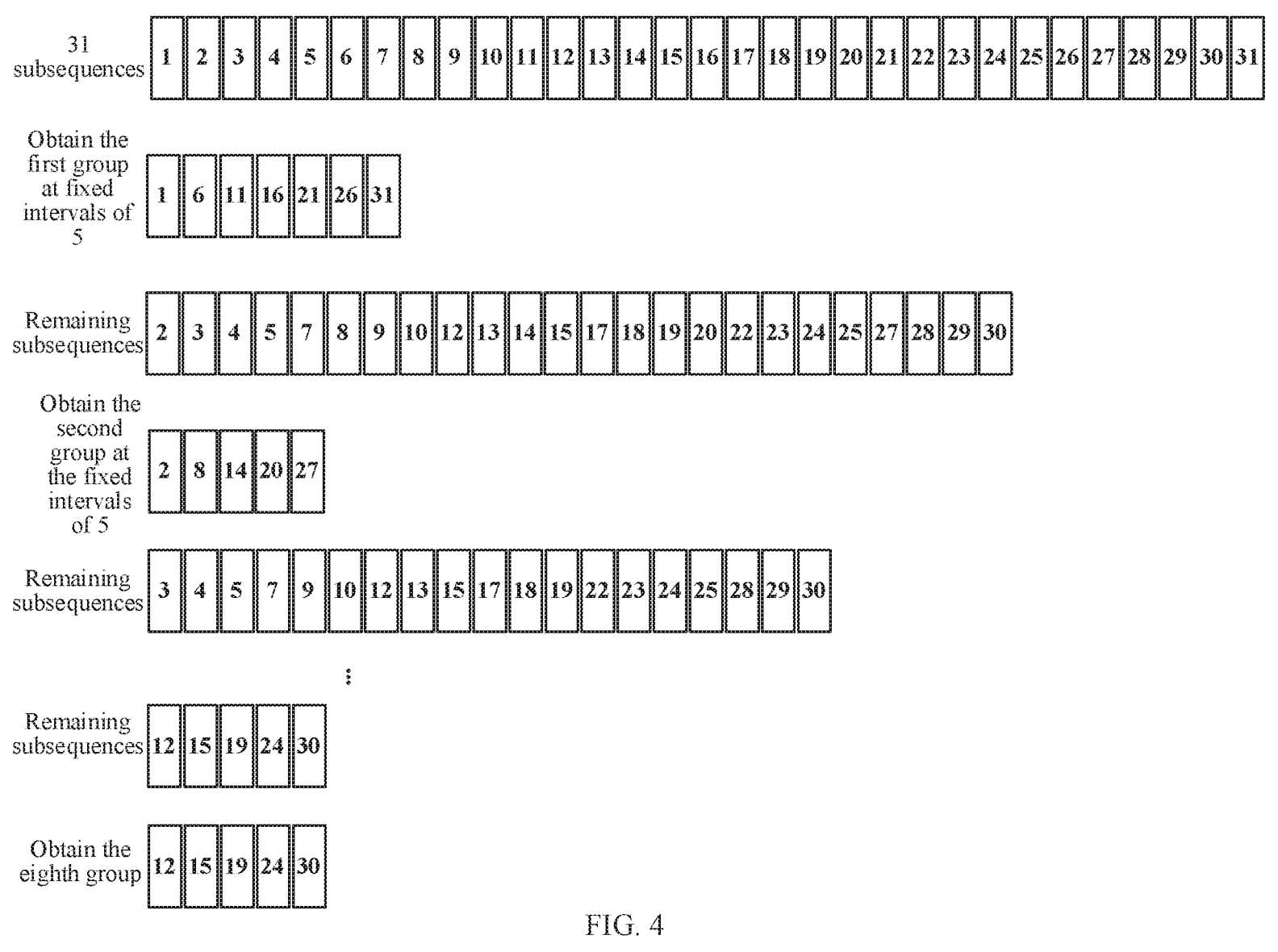

As shown in FIG. 4, It is assumed that L=31, and subsequence groups are obtained in Manner 3. Numbers are selected from 1 to 31 at intervals of five, to obtain the first group of numbers [1, 6, 11, 16, 21, 26, 31]. Numbers in the first group are removed from the numbers 1 to 31, and numbers are selected from remaining numbers at intervals of five, to obtain the second group of numbers [2, 8, 14, 20, 27]. By such analogy, obtained column quantities included in the third group are [3, 10, 18, 25], and column quantities included in the fourth group are [4, 13, 23], until the eighth group of data is [12, 15, 19, 24, 30].

It is assumed that L=31, and subsequence groups are obtained in Manner 4. Numbers are selected from 1 to 31 at intervals of five, and numbers are then selected from remaining numbers at intervals of five. By such analogy, a number order sequence [1, 6, 11, 16, 21, 26, 31, 2, 8, 14, 20, 27, 3, 10, 18, 25, 4, 13, 23, 5, 17, 29, 7, 22, 9, 28, 12, 15, 19, 24, 30] may be obtained. For example, S=5, and a quantity of subsequences in each group is determined based on [31/5] or [31/5]. Assuming that the quantity of subsequences in each group is 6, and the last one redundant subsequence may be placed in any group, or form one group, obtained subsequence groups are: [1, 6, 11, 16, 21, 26], [31, 2, 8, 14, 20, 27], [3, 10, 18, 25, 4, 13], [23, 5, 17, 29, 7, 22], and [9, 28, 12, 15, 19, 24, 30].

It is assumed that L=11, and subsequence groups are obtained in Manner 5. Obtained subsequence groups may be

[1, 11, 6], [2, 10, 5], [3, 9, 7], and [4, 8], or obtained subsequence groups are [1, 11, 6], [2, 10, 7], [3, 9, 5], and [4, 8]. Alternatively, a number order sequence [1, 11, 6, 2, 10, 5, 3, 9, 7, 4, 8] or [1, 11, 6, 2, 10, 7, 3, 9, 5, 4, 8] may be first obtained. Then grouping is performed based on a new number order sequence.

In this embodiment of this application, the quantity L of the subsequences and the quantity S of the subsequence groups may be determined by a combination of at least several factors. For example, first, the quantity L of the subsequences and the quantity S of the subsequence groups may be associated with a modulation order, and the quantity S of the subsequence groups is a function form of the modulation order; second, the quantity L of the subsequences and the quantity S of the subsequence groups may also be associated with actual hardware implementation, in the actual hardware implementation, S is a power of 2, and operation is relatively easy; and third, the quantity L of the subsequences and the quantity S of the subsequence groups may also be associated with being randomized as much as possible, and S is a prime number as much as possible.

In this embodiment of this application, the foregoing several factors are considered. That L=31 is used as an example, to further describe the foregoing interleaving method in detail. Herein, L is considered to 31 because of two main factors: First, 31 is a prime number, and has an innate advantage on generation of a random number; and second, 31 is close to a fixed column quantity 32 of an outer interleaver of a turbo code (Turbo code) in LTE. Certainly, L may be selected as any other value, for example, may be another value easy to implement on hardware, for example, {16, 32, 64}, or be considered as another prime number, for example, {7, 11, 13, 19, 23, 29, 37, 61}.

First, a to-be-interleaved bit sequence having a length of M is obtained, and the to-be-interleaved bit sequence is input into an interleaver. Optionally, a column quantity of the interleaver may be fixed to 31, grouping is performed based on numbers of columns, and then intra-group interleaving is performed; or a row quantity of the interleaver may be fixed to 31, grouping is performed based on numbers of rows, and then intra-group interleaving is performed That the column quantity of the interleaver is fixed to 31 is used as an example. The numbers of the columns are 1 to 31, and certainly may alternatively be 0 to 30. Bits in one column are one subsequence. The row quantity is a result obtained by rounding up or rounding down a value obtained by dividing M by 31, and the obtained result is a quantity of bits in one column. If bits in the last subsequence are insufficient, NULL may be used for filling. The 31 columns are divided into S subsequence groups, and it is assumed that a value of S is 5. The value of S is selected as 5 in consideration of: in higher order modulation, 1 may be added to S or S may be reduced by 1 by associating S with a current modulation order, if a modulation scheme is 16 QAM, the modulation order is 4, if the modulation scheme is 64 QAM, the modulation order is 6, or if 1 is added to both modulation orders, S corresponds to [5, 7] respectively, if both the modulation orders are reduced by 1, a quantity of groups corresponds to [3, 5] respectively, uniform processing is considered herein, and the quantity of subsequence groups is set to 5. When higher order modulation 256 QAM is used, the quantity 5 of subsequence groups can still continue to be used because 5 may be associated with the modulation order, and is a prime number. Certainly, the quantity of subsequence groups may be completely associated with the modulation order, so that grouping corresponding to different modulation orders is different.

Figure 5:
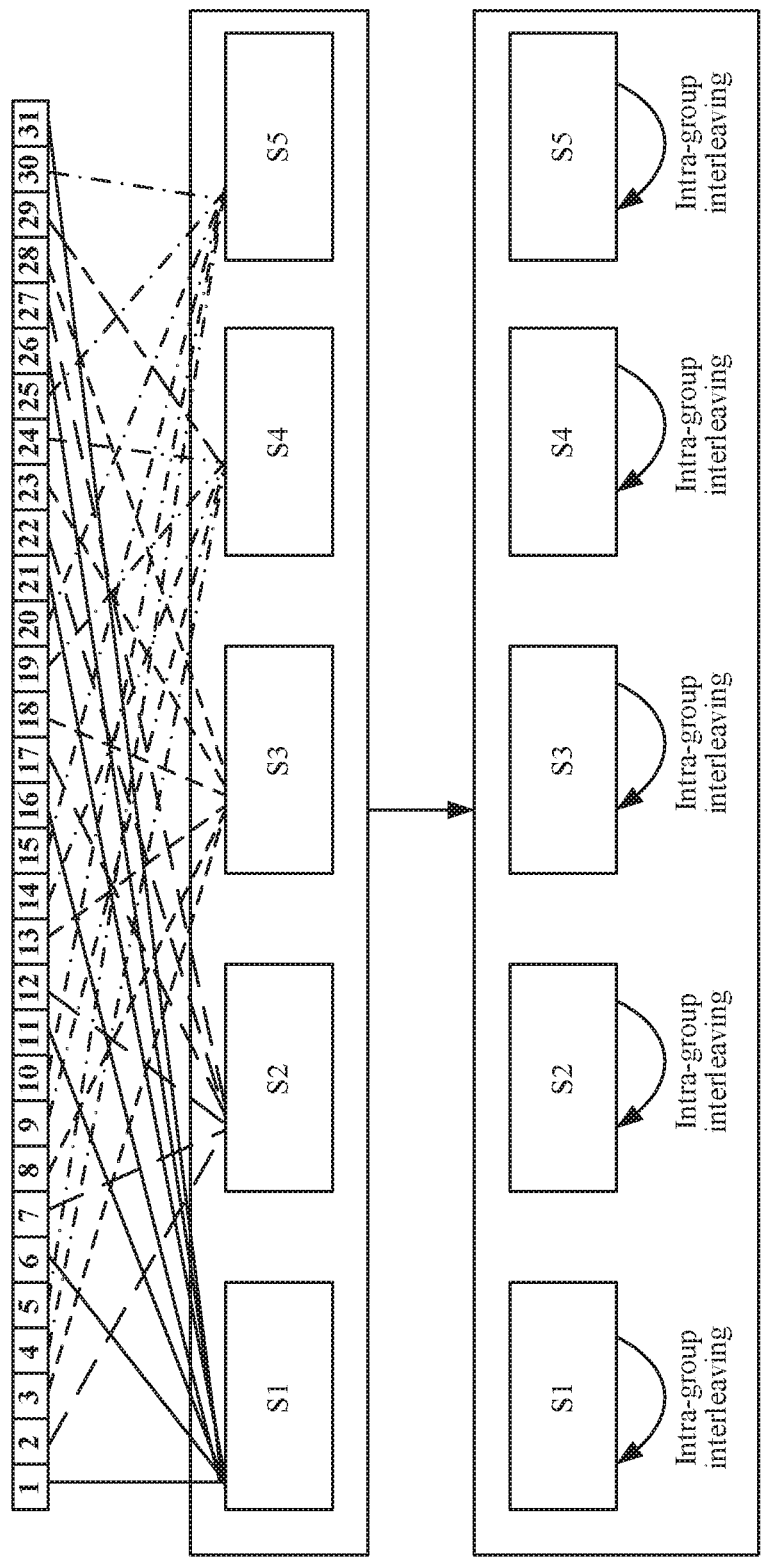
FIG. 5 is a schematic flowchart of an interleaving method in manner 1 according to an embodiment of this application.

Assuming that the subsequence groups are obtained in Manner 1, as shown in FIG. 5, a modulo-5 operation is performed on the numbers 1 to 31, and remainders are 1, 2, 3, 4, and 0. Numbers whose remainders are 1 are in one group, to obtain a subsequence group S1, and subsequences included in S1 are [1, 6, 11, 16, 21, 26, 31]; numbers whose remainders are 2 are in one group, to obtain a subsequence group S2, and subsequences included in S2 are [2, 7, 12, 17, 22, 27]; numbers whose remainders are 3 are in one group, to obtain a subsequence group S3, and subsequences included in S3 are [3, 8, 13, 18, 23, 28]; numbers whose remainders are 4 are in one group, to obtain a subsequence group S4, and subsequences included in S4 are [4, 9, 14, 19, 24, 29]; and numbers whose remainders are 0 are in one group, to obtain a subsequence group S5, and subsequences included in S5 are [5, 10, 15, 20, 25, 30]. Then intra-group interleaving is performed on bits in each subsequence group. A specific intra-group interleaving method is described above. It may be found that a quantity of the subsequences in S1 is 7, and a quantity of subsequences in each of other subsequence group is 6. More generally, it is assumed that a quantity of to-be-grouped subsequences is L, a quantity of subsequence groups is S, and a quantity of subsequences included in each group is a minimum of [L/S]. Then a quantity Rg of remaining subsequences is performing an REM operation on S by using L. The remaining subsequences may be respectively placed in the first to $Rg^{th}$ groups in order, or may be first placed in even (odd) groups, and then placed in odd (even) group, or may be randomly placed in first several subsequence groups based on a simple function.

Figure 6:
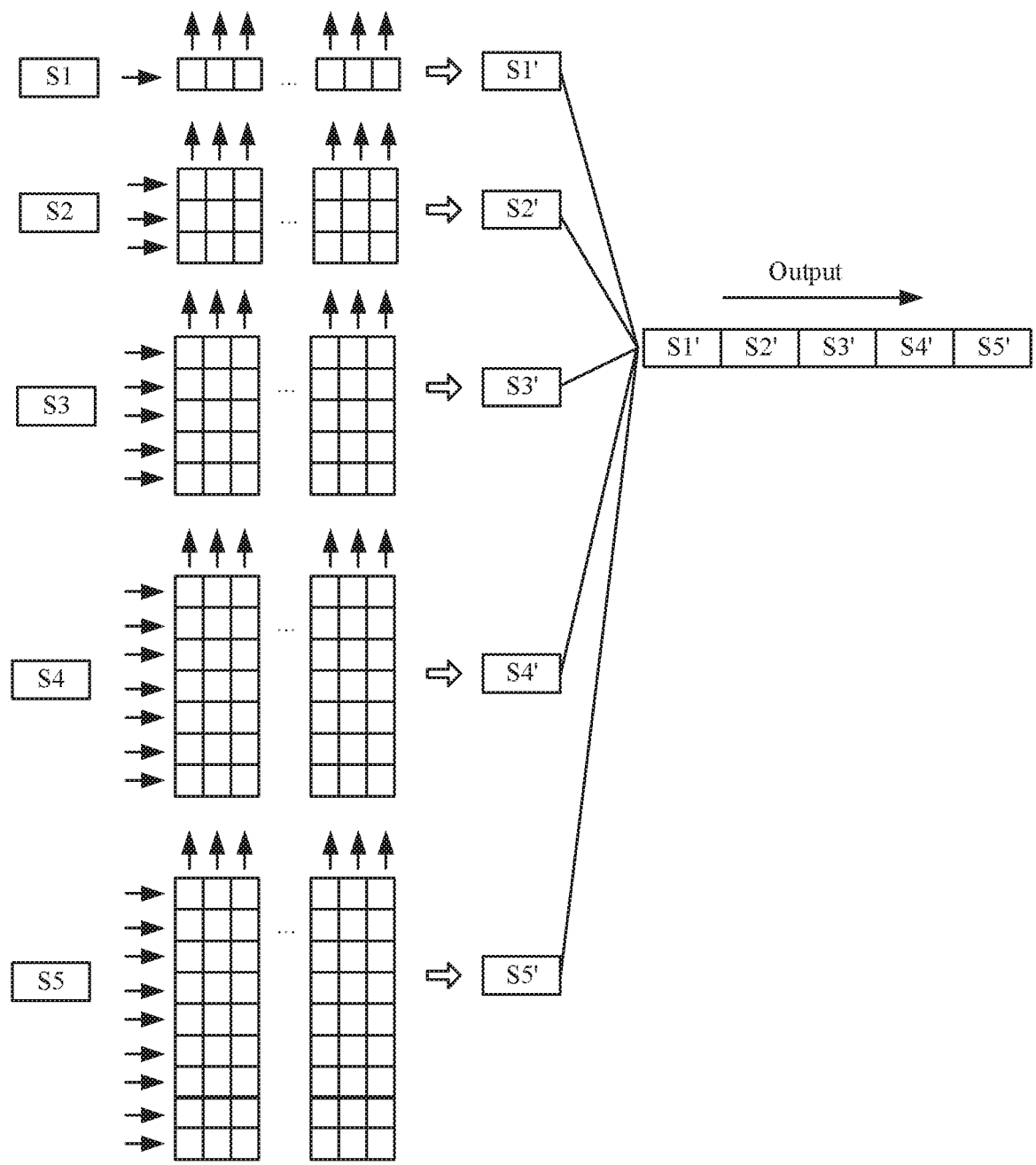
FIG. 6 is a schematic diagram of an intra-group interleaving method according to an embodiment of this application.

For example, row-column interleaving is used for intra-group interleaving, a written and read manner is row-in and column-out, interleave depths of at least groups are different. Optionally, interleave depths of any two groups are different. For example, as shown in FIG. 6, no interleaving is used for the subsequence group S1, to be specific, writing into and reading out are performed in order; an interleave depth of the subsequence group S2 is 3, a row quantity is fixed to 3, a column quantity is calculated based on the row quantity 3, and writing into and reading out are performed in a row-in and column-out rule; an interleave depth of the subsequence group S3 is 5, a row quantity is fixed to 5, a column quantity is calculated based on the row quantity 5, and writing into and reading out are performed in a row-in and column-out rule; an interleave depth of the subsequence group S4 is 7, a row quantity is fixed to 7, a column quantity is calculated based on the row quantity 7, and writing into and reading out are performed in a row-in and column-out rule; and an interleave depth of the subsequence group S5 is 9, a row quantity is fixed to 9, a column quantity is calculated based on the row quantity 9, and writing into and reading out are performed in a row-in and column-out rule. Finally, after intra-group interleaving is performed on each subsequence, subsequences may be output in order, or be output after simple location interleaving is performed. FIG. 6 schematically shows only the output in order.

Optionally, the quantity S of the subsequence groups may take any other value, for example, may take a value from [2, 3, 4, 6, 7]. Similarly, a modulo operation may be separately performed on 31 based on [2, 3, 4, 6, 7], to obtain different subsequence groups. For each subsequence group, during intra-group interleaving, selected interleave depths may also be different. When S=2, to be specific, when column data is rearranged based on an odd group and an even group, interleave depths need to have apparent difference to achieve more randomicity, interleave depths of the subsequence groups S1 to S5 may be {1, 7}, {3, 11}, {5, 10}, {7, 11}, or the like. When S=3, interleave depths of the subsequence groups S1 to S5 may be {1, 3, 5}, {3, 5, 7}, {3, 7, 11}, {5, 7, 11}, {2, 4, 6}, or the like. When S=4, interleave depths of the subsequence groups S1 to S5 may be {1, 3, 5, 7}, {3, 5, 7, 9}, {3, 5, 7, 11}, {5, 7, 11, 13}, {2, 4, 6, 8}, {2, 5, 8, 11}, or the like. When S=6, interleave depths of the subsequence groups S1 to S5 may be {1, 3, 5, 7, 9, 11}, {1, 3, 5, 1, 3, 5}, {5, 7, 9, 5, 7, 9}, {3, 3, 5, 5, 7, 7}, {3, 7, 11, 3, 7, 11}, {2, 4, 6, 8, 10, 12}, {2, 4, 6, 6, 4, 2}, {5, 7, 9, 9, 7, 5}, {11, 9, 7, 7, 9, 11}, or the like. When S=7, interleave depths of the subsequence groups S1 to S5 may be {1, 3, 5, 7, 9, 11, 13}, {1, 3, 5, 7, 7, 5, 3, 1}, {5, 7, 9, 11, 9, 7, 5}, {3, 3, 5, 5, 7, 7, 9}, {3, 3, 7, 7, 11, 11, 1}, {2, 4, 6, 8, 10, 12, 14}, {2, 4, 6, 8, 6, 4, 2}, {5, 7, 9, 11, 9, 7, 5}, {11, 9, 7, 5, 7, 9, 11}, or the like.

Like description of the intra-group interleaving manner above, all intra-group bits may enter the interleaver for interleaving, or each of intra-group subsequences may be interleaved within the subsequence, bits in the subsequences enter the interleaver for interleaving, and then output bits constitute an interleaved. subsequence group. For example, all bits of the subsequences [1, 6, 11, 16, 21, 26, 31] included in S1 enter the interleaver for interleaving, or the first column is used as to-be-interleaved bits to enter the interleaver for interleaving, the sixth column is used as to-be-interleaved bits to enter the interleaver for interleaving, and similarly, the $11^{th}$ column, the $16^{th}$ column, the $21^{st}$ column, the $26^{th}$ column, and the $31^{st}$ column separately enter the interleaver for interleaving. Optionally, order locations of the subsequences [1, 6, 11, 16, 21, 26, 31] are interleaved before bit interleaving. An interleaving method is not limited. For example, interleaved subsequences are [11, 26, 1, 6, 31, 16, 21].

Similarly, if a row quantity of the interleaver is fixed to 31, numbers of rows are 1 to 31, bits in one row are one subsequence, a column quantity is a result obtained. by rounding up or rounding down a value obtained by dividing a quantity of to-be-interleaved bits by 31, the obtained result is a quantity of the bits in one row, and NULL may be filled in the last subsequence if bits in the last subsequence are insufficient. The 31 rows are divided into S subsequence groups, and it is assumed that a value of S is 5. For a method for grouping the 31 rows and a method for intra-group interleaving, refer to the methods used when the column quantity of the interleaver is fixed to 31. Methods used in two cases are similar. Repetitions are not described herein again.

In the example in which L=31, that the subsequence groups are obtained in Manner 1 is used as an example. It may be understood that, any one of the foregoing manners may be selected to obtain the subsequence groups, and an intra-group interleaving method of subsequences that is described subsequently in an example is also applicable.

Optionally, if a column quantity of the interleaver is fixed to L=31, numbers of columns are 1 to 31, bits in one column are one subsequence, and a row quantity is a result obtained by rounding up a value obtained by dividing a quantity of to-be-interleaved bits by 31. 31 columns of data are divided into S subsequence groups, and it is assumed that a value of S is 5. Data in each group is exchanged based on rows. Row exchange manners in groups may be different. For example, rows of the first group of data are not exchanged, and data is directly read out in column or row order; orders of rows of the second group of data are exchanged at intervals of 3; orders of rows of the third group of data are exchanged at intervals of 5; orders of rows of the fourth group of data are exchanged at intervals of 7; and orders of rows of the fifth group of data are exchanged at intervals of 11. Assuming that the interleaver has R rows and L columns, and intervals are T, a row order of each group of rows after exchange may be represented as [1:T:R, 2:T:R, 3:T:R, . . . T:T:R]. Values of the intervals T of groups may not be fixed. A main principle is that row exchange manners of the groups cannot be completely the same. For example, row exchange intervals of the five groups of data may be [1, 3, 5, 7, 9] or the like, and are not limited. In addition, a row exchange order of each group is not limited to the foregoing form. Exchange may be performed in another order. For example, the first group of data is not exchanged, the second group of data is exchanged at intervals, the third group of data is exchanged in a bit reversal order manner, the fourth group of data is exchanged in a parity manner, and the fifth group of data is exchanged in a reversal order manner.

Optionally, if a row quantity of the interleaver is fixed to L=31, numbers of rows are 1 to 31, bits in one row are one subsequence, and a column quantity is a result obtained by rounding up a value obtained by dividing a quantity of to-be-interleaved bits by 31. 31 rows of data are divided into S subsequence groups, and it is assumed that a value of S is 5. Data in each group is exchanged based on columns. Column exchange manners in groups may be different. For example, columns of the first group of data are not exchanged, and data is directly read out in column or row order; orders of columns of the second group of data are exchanged at intervals of 3; orders of columns of the third group of data are exchanged at intervals of 5; orders of columns of the fourth group of data are exchanged at intervals of 7; and orders of columns of the fifth group of data are exchanged at intervals of 11. Assuming that the interleaver has C columns and L rows, and intervals are T, a column order of each group of columns after exchange may be represented as [1:T:C, 2:T:C, 3:T:C, . . . T:T:C]. Values of the intervals T of groups may not be fixed. A main principle is that row exchange manners of the groups cannot be completely the same. For example, column exchange intervals of the five groups of data may be [1, 3, 5, 7, 9] or the like, and are not limited. In addition, a column exchange order of each group is not limited to the foregoing form. Exchange may be performed in another order. For example, the first group of data is not exchanged, the second group of data is exchanged at intervals, the third group of data is exchanged in a bit reversal order manner, the fourth group of data is exchanged in a parity manner, and the fifth group of data is exchanged in a reversal order manner.

Optionally, if a row quantity of the interleaver is fixed to L=31, numbers of rows are 1 to 31, bits in one row are one subsequence, and a column quantity C is a result obtained by rounding up a value obtained by dividing a quantity of to-be-interleaved bits by 31. C columns of data are divided into S subsequence groups, and it is assumed that a value of S is 5. Data in each group is exchanged based on rows. Row exchange manners in groups may be different. For example, rows of the first group of data are not exchanged, and data is directly read out in row or column order; orders of rows of the second group of data are exchanged at intervals of 3; orders of rows of the third group of data are exchanged at intervals of 5; orders of rows of the fourth group of data are exchanged at intervals of 7; and orders of rows of the fifth group of data are exchanged at intervals of 11. Assuming that the interleaver has C columns and L rows, and intervals are T, a row order of each group of rows after exchange may be represented as [1:T:L, 2:T:L, 3:T:L, . . . T:T:L]. Values of the intervals T of groups may not be fixed. A main principle is that row exchange manners of the groups cannot be completely the same. For example, row exchange intervals of the five groups of data may be [1, 3, 5, 7, 9] or the like, and are not limited. In addition, a row exchange order of each group is not limited to the foregoing form. Exchange may be performed in another order. For example, the first group of data is not exchanged, the second group of data is exchanged at intervals, the third group of data is exchanged in a bit reversal order manner, the fourth group of data is exchanged in a parity manner, and the fifth group of data is exchanged in a reversal order manner.

Optionally, if a column quantity of the interleaver is fixed to L=31, numbers of columns are 1 to 31, bits in one column are one subsequence, and a row quantity R is a result obtained by rounding up a value obtained by dividing a quantity of to-be-interleaved bits by 31. R rows of data are divided into S subsequence groups, and it is assumed that a value of S is 5. Data in each group is exchanged based on columns. Column exchange manners in groups may be different. For example, columns of the first group of data are not exchanged, and data is directly read out in column or row order; orders of columns of the second group of data are exchanged at intervals of 3; orders of columns of the third group of data are exchanged at intervals of 5; orders of columns of the fourth group of data are exchanged at intervals of 7; and orders of columns of the fifth group of data are exchanged at intervals of 11. Assuming that the interleaver has L columns and R rows, and intervals are T, a row order of each group of rows after exchange may be represented as [1:T:L, 2:T:L, 3:T:L, . . . T:T:L]. Values of the intervals T of groups may not be fixed. A main principle is that column exchange manners of the groups cannot be completely the same. For example, column exchange intervals of the five groups of data may be [1, 3, 5, 7, 9] or the like, and are not limited. In addition, a column exchange order of each group is not limited to the foregoing form. Exchange may be performed in another order. For example, the first group of data is not exchanged, the second group of data is exchanged at intervals, the third group of data is exchanged in a bit reversal order manner, the fourth group of data is exchanged in a parity manner, and the fifth group of data is exchanged in a reversal order manner.

Optionally, if a row quantity of the interleaver is fixed to L=31, numbers of rows are 1 to 31, bits in one row are one subsequence, and a column quantity is a result obtained by rounding down a value obtained by dividing a quantity of to-be-interleaved bits by 31. When the quantity of to-be-interleaved bits is not exactly divided by 31, remaining bits may be placed in a plurality of subsequences in a scattered manner, or be placed in one subsequence in a centralized manner. A group manner may be the same as that in the foregoing description. Details are not described herein again.

In conclusion, in this embodiment of this application, the subsequence groups are obtained and different interleaving manners are used in the subsequence groups, so that a polar code can be combined, an interleaving effect is made better, and performance of the polar code is improved.

In this embodiment of this application, at a decoder side, a decoding procedure is approximately: performing deinterleaving and rate dematching on a received to-be-decoded sequence, and performing polar code decoding on an obtained sequence. Similarly, on the decoder side, a deinterleaving method corresponding to an interleaving method on an encoder side may be obtained based on the interleaving method on the encoder side, and a deinterleaving operation is performed based on the obtained deinterleaving method.

The deinterleaving method is determined based on the interleaving method. The deinterleaving method is an inverse operation of the interleaving method. For example, a second sequence is obtained after the first sequence is interleaved by using the interleaving method, and the first sequence can be obtained by using the second sequence by using the deinterleaving method determined based on the interleaving method. If the interleaving method is row-in and column-out interleaving, the deinterleaving method is column-in and row-out deinterleaving. The interleaving method on the encoder side is described as above. Details are not described herein again.

Specifically, when the interleaving method on the encoder side is obtained at a received end, an interleaving pattern is obtained. Without loss of generality, input data is represented in a form of a vector. For example, there are A bits (A>=1). Through the interleaving method on the encoder side, A bits are written as a vector having a length of A by rows. An $(a\_interleave)^{th}$ ($1<=a\_interleave<=A$) bit $b_{a\_interleave}$ is obtained by interleaving an $(a\_original)^{th}$ ($1<=a\_original<=A$) bit $b_{a\_original}$ that is not interleaved. Correspondingly, at the receive end, the receive end needs to learn of the interleaving pattern (or a mapping relationship) or another equivalent representation method. A deinterleaving operation (namely, the inverse operation of the interleaving method) is writing to-be-deinterleaved bits as a vector having a length of A, and deinterleaving (or inverse mapping) the $(a\_interleave)^{th}$ bit $b_{a\_interleave}$ to a location of the $(a\_original)^{th}$ bit as $b_{a\_original}$ based on the interleaving pattern or another equivalent representation method. Certainly, a method of writing as a vector having a length of A on the receive end and a transmit end is also applicable. In fact, the receive end and the transmit end only need to agree that a vector having a length of A is generated by using a same method, or a vector having a length of A is generated by using a same method according to a protocol.

Similarly, a manner of writing as a matrix may further be used. To be specific, the input data is represented in a form of a matrix. For example, the input data is written into a B-row and C-column matrix (B>=1, and C>=1). Through the interleaving method on the encoder side, a bit $b_{a\_interleave}$ in an $(a\_i\_interleave)^{th}$ row and an $(a\_j\_interleave)^{th}$ column ($1<=a\_i\_interleave<=B$, and $1<=a\_j\_interleave<=C$) is obtained by interleaving a bit $b_{a\_original}$ that is in an $(a\_i\_original)^{th}$ row and an $(a\_j\_original)^{th}$ column and that is not interleaved. Correspondingly, at the receive end, the receive end needs to learn of the interleaving pattern (or a mapping relationship) or another equivalent representation method. A deinterleaving operation (namely, the inverse operation of the interleaving method) is writing to-be-deinterleaved bits as a B-row and C-column matrix in the rule same as the transmit end, and deinterleaving (or inverse mapping) the bit $b_{a\_interleave}$ in the $(a\_i\_interleave)^{th}$ row and the $(a\_j\_interleave)^{th}$ column to a location in the $(a\_i\_original)^{th}$ row and the $(a\_j\_original)^{th}$ column as $b_{a\_original}$ based on the interleaving pattern or another equivalent representation method. For example, if the transmit end performs a row-in and column-out operation, the receive end performs a column-in and row-out operation; if the transmit end performs a column-in and row-out operation, the receive end performs a row-in and column-out operation; if the transmit end performs a row-in and row-out operation, the receive end performs a row-in and row-out operation; if the transmit end performs a column-in and column-out operation, the receive end performs a column-in and column-out operation; or based on the interleaving method, B=31 or C=31.

Figure 7:
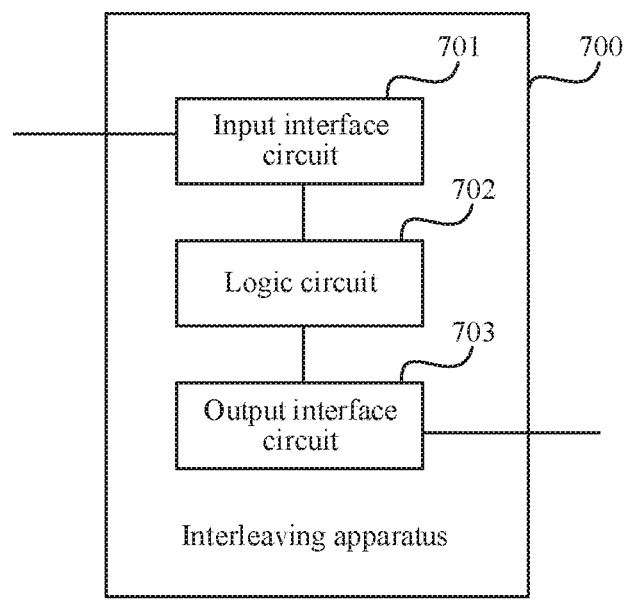
FIG. 7 is a first schematic structural diagram of an interleaving apparatus according to an embodiment of this application.

Based on an invention conception same as the interleaving method shown in FIG. 3, as shown in FIG. 7, an embodiment of this application further provides an interleaving apparatus 700. The interleaving apparatus 700 is configured to perform the interleaving method shown in FIG. 3. A part of all of the interleaving method shown in FIG. 3 may be implemented by using hardware, or may be implemented by using software. When the part of all of the interleaving method is implemented by using the hardware, the interleaving apparatus 700 includes: an input interface circuit 701, configured to obtain a to-be-interleaved bit sequence; a logic circuit 702, configured to perform the interleaving method shown in FIG. 3, where for details, refer to description in the method embodiment, and details are not described herein again; and an output interface circuit 703, configured to output the interleaved bit sequence.

Optionally, the interleaving apparatus 700 may be a chip or an integrated circuit during specific implementation.

Figure 8:
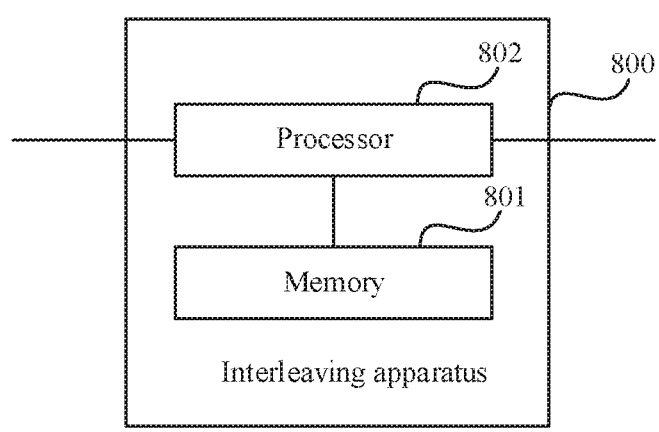
FIG. 8 is a second schematic structural diagram of an interleaving apparatus according to an embodiment of this application.

Optionally, when the part of all of the interleaving method in the foregoing embodiment is implemented by using the software, as shown in FIG. 8, an interleaving apparatus 800 includes: a memory 801, configured to store a program; and a processor 802. configured to execute the program stored in the memory 801, where when the program is executed, the interleaving apparatus 800 is enabled to implement the interleaving method provided in the foregoing embodiment of FIG. 3.

Optionally, the memory 801 may be a physically independent unit, or may be integrated with the processor 802.

Optionally, when the part of all of the interleaving method in the foregoing embodiment of FIG. 3 is implemented by using the software, the interleaving apparatus 800 may alternatively include only a processor 802. A memory 801 configured to store a program is located outside the interleaving apparatus 800. The processor 802 is connected to the memory 801 through a circuit/wire. and is configured to read and execute the program stored in the memory 801.

The processor 802 may be a central processing unit (central processing unit, CPU), a network processor (network processor, NP), or a combination of a CPU and an NP.

The processor 802 may further include a hardware chip. The hardware chip may be an application-specific: integrated circuit (application-specific integrated circuit, ASIC), a programmable logic device (programmable logic device, PLD), or a combination thereof. The PLD may be a complex programmable logic device (complex programmable logic device, CPLD), a field-programmable gate array (field-programmable gate array, FPGA), a generic array logic (generic array logic, GAL), or any combination thereof.

The memory 801 may include a volatile memory (volatile memory), for example, a random-access memory (random-access memory, RAM). The memory may also include a non-volatile memory (non-volatile memory), for example, a flash memory (flash memory), a hard disk drive (hard disk drive, HDD), or a solid-state drive (solid-state drive, SSD). The memory may further include a combination of the foregoing types of memories.

Figure 9:
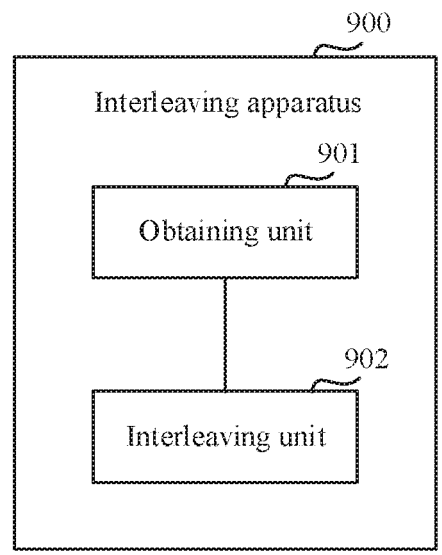
FIG. 9 is a third schematic structural diagram of an interleaving apparatus according to an embodiment of this application.

Based on an invention conception same as the interleaving method shown in FIG. 3, as shown in FIG. 9. an embodiment of this application further provides an interleaving apparatus 900. The interleaving apparatus 900 is configured to perform the interleaving method shown in FIG. 3. The interleaving apparatus 900 includes: an obtaining unit 901, configured to obtain a to-be-interleaved bit sequence, where the to-be-interleaved bit sequence includes L subsequences. the L subsequences include at least a first subsequence group and a second subsequence group, the first subsequence group includes at least two subsequences, the second subsequence group includes at least one subsequence, and L is a positive integer greater than 1: and an interleaving unit 902, configured to interleave, in a first interleaving manner, the subsequences in the first subsequence group obtained by the obtaining unit 901, and skip interleaving the subsequence in the second subsequence group or interleave the subsequence in the second subsequence group in a second interleaving manner.

Optionally, a result obtained by performing a modulo operation on a number of each subsequence in the first subsequence group based on a specified value is a first operation result; and a result obtained by performing a modulo operation on a number of each subsequence in the second subsequence group based on the specified value is a second operation result.

Optionally, the first interleaving manner is first row-column interleaving, the second interleaving manner is second row-column interleaving, and row quantities or column quantities of the first row-column interleaving and the second row-column interleaving are different.

Optionally, the interleaving unit 902 is configured to: input all bits in the first subsequence group into an interleaver one by one for row-column interleaving; or perform row-column interleaving on each of some or all of the subsequences in the first subsequence group within the subsequence.

Optionally, the interleaving unit 902 is configured to: interleave locations of the subsequences in the first subsequence group; and input all bits in the first subsequence group into a row-column interleaver for row-column interleaving; or perform row-column interleaving on each subsequence in the first subsequence group within the subsequence.

Optionally, the interleaving unit 902 is further configured to: after the obtaining unit obtains the to-be-interleaved bit sequence, and before interleaving the subsequences in the first subsequence group in the first interleaving manner, and skipping interleaving the subsequence in the second subsequence group or interleaving the subsequence in the second subsequence group in the second interleaving manner, input the to-be-interleaved bit sequence into an i-row and j-column interleaver; and if i=L, and one row of bits constitute one subsequence, read the subsequences in the first subsequence group row by row, and read subsequences in the second subsequence group row by row; or if j=L, and one column of bits constitute one subsequence, read the subsequences in the first subsequence group column by column, and read subsequences in the second subsequence group column by column.

Optionally, the interleaving unit 902 is further configured to: after the obtaining unit 901 obtains the to-be-interleaved bit sequence, and before interleaving the subsequences in the first subsequence group in the first interleaving manner, and skipping interleaving the subsequence in the second subsequence group or interleaving the subsequence in the second subsequence group in the second interleaving manner, group the L subsequences, to obtain the first subsequence group and the second subsequence group.

Optionally, a value of L is 31.

Optionally, the interleaving unit 902 is further configured to interleave locations of the first subsequence group and the second subsequence group.

Figure 10:
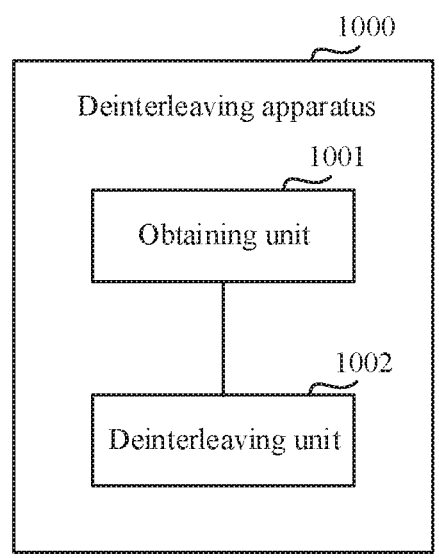
FIG. 10 is a first schematic structural diagram of a deinterleaving apparatus according to an embodiment of this application.

Based on an invention conception same as the deinterleaving method provided in the foregoing embodiment, as shown in FIG. 10, an embodiment of this application further provides a deinterleaving apparatus 1000. The deinterleaving apparatus 1000 may be configured to perform a deinterleaving method provided in this embodiment of this application. The deinterleaving apparatus 1000 includes: an obtaining unit 1001, configured to obtain a to-be-deinterleaved bit sequence; and a deinterleaving unit 1002, configured to perform a deinterleaving operation on the to-be-deinterleaved bit sequence based on the deinterleaving method, where the deinterleaving method is determined based on an interleaving method, and the deinterleaving method is an inverse operation of the interleaving method.

The interleaving method includes: obtaining a to-be-interleaved bit sequence, where the to-be-interleaved bit sequence includes L subsequences, the L subsequences include at least a first subsequence group and a second subsequence group, the first subsequence group includes at least two subsequences, the second subsequence group includes at least one subsequence, and L is a positive integer greater than 1; and interleaving the subsequences in the first subsequence group in a first interleaving manner, and skipping interleaving the subsequence in the second subsequence group or interleaving the subsequence in the second subsequence group in a second interleaving manner.

Optionally, a result obtained by performing a modulo operation on a number of each subsequence in the first subsequence group based on a specified value is a first operation result; and a result obtained by performing a modulo operation on a number of each subsequence in the second subsequence group based on the specified value is a second operation result.

Optionally, the first interleaving manner is first row-column interleaving, the second interleaving manner is second row-column interleaving, and row quantities or column quantities of the first row-column interleaving and the second row-column interleaving are different.

Optionally, the interleaving the subsequences in the first subsequence group in a first interleaving manner includes: inputting all bits in the first subsequence group into an interleaver one by one for row-column interleaving; or performing row-column interleaving on each of some or all of the subsequences in the first subsequence group within the subsequence.

Optionally, after the obtaining a to-be-interleaved bit sequence, and before the interleaving the subsequences in the first subsequence group in a first interleaving manner, and skipping interleaving the subsequence in the second subsequence group or interleaving the subsequence in the second subsequence group in a second interleaving manner, the interleaving method further includes: inputting the to-be-interleaved bit sequence into an i-row and j-column interleaver; and if i=L, and one row of bits constitute one subsequence, reading the subsequences in the first subsequence group row by row, and reading subsequences in the second subsequence group row by row; or if j=L, and one column of bits constitute one subsequence, reading the subsequences in the first subsequence group column by column, and reading subsequences in the second subsequence group column by column.

Optionally, after the obtaining a to-be-interleaved bit sequence, and before the interleaving the subsequences in the first subsequence group in a first interleaving manner, and skipping interleaving the subsequence in the second subsequence group or interleaving the subsequence in the second subsequence group in a second interleaving manner, the interleaving method further includes: grouping the L subsequences, to obtain the first subsequence group and the second subsequence group.

Figure 11:
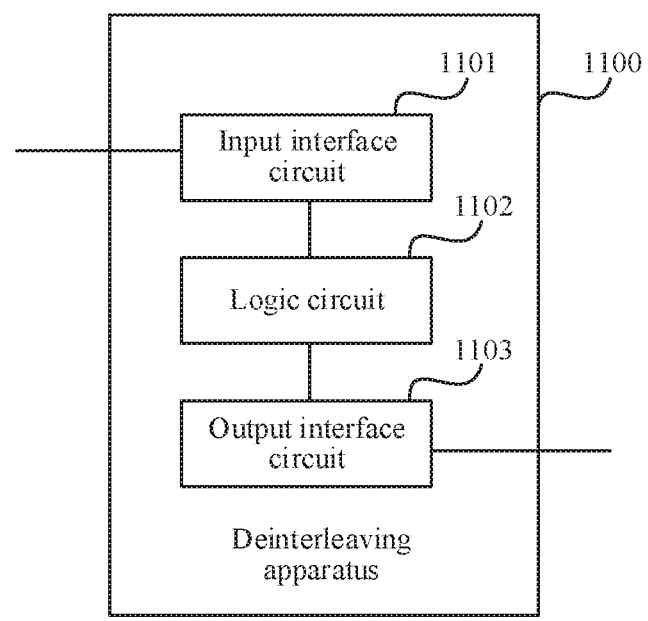
FIG. 11 is a second schematic structural diagram of a deinterleaving apparatus according to an embodiment of this application.

Based on an invention conception same as the deinterleaving method provided in the foregoing embodiment, as shown in FIG. 11, an embodiment of this application further provides a deinterleaving apparatus 1100. The deinterleaving apparatus 1100 is configured to perform the deinterleaving method. A part or all of the deinterleaving method may be implemented by using hardware, or may be implemented by using software. When the part or all of the deinterleaving method is implemented by using the hardware, the deinterleaving apparatus 1100 includes: an input interface circuit 701, configured to obtain a to-be-deinterleaved bit sequence; a logic circuit 702, configured to perform the deinterleaving method; and an output interface circuit 703, configured to output the deinterleaved sequence.

Optionally, the interleaving apparatus 1100 may be a chip or an integrated. circuit during specific implementation.

Figure 12:
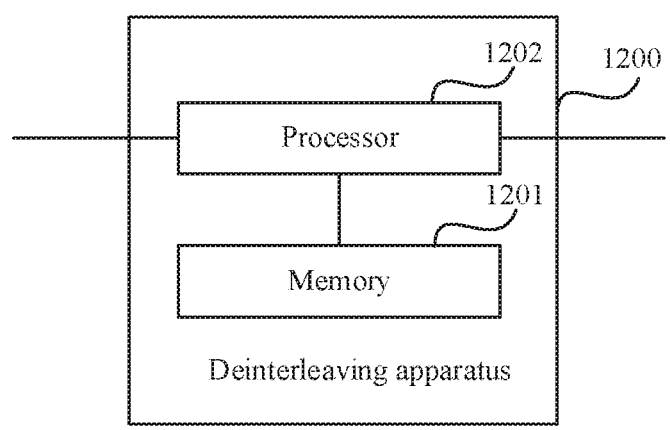
FIG. 12 is a third schematic structural diagram of a deinterleaving apparatus according to an embodiment of this application.

Optionally, when the part of all of the interleaving method in the foregoing embodiment is implemented by using the software, as shown in FIG. 12, a deinterleaving apparatus 1200 includes: a memory 1201, configured to store a program; and a processor 1202, configured to execute the program stored in the memory 1201, where when the program is executed, the deinterleaving apparatus 1200 may implement the deinterleaving method provided in the foregoing embodiment.

Optionally, the memory 1201 may be a physically independent unit, or may be integrated with the processor 1202.

Optionally, when the part of all of the deinterleaving method in the foregoing embodiment is implemented by using the software, the deinterleaving apparatus 1200 may alternatively include only a processor 1202. A memory 1201 configured to store a program is located outside the deinterleaving apparatus 1200. The processor 1202 is connected to the memory 1201 through a circuit/wire, and is configured to read and execute the program stored in the memory 1201.

The processor 1202 may be a central processing unit (central processing unit, CPU), a network processor (network processor, NP), or a combination of a CPU and an NP.

The processor 1202 may further include a hardware chip. The hardware chip may be an application-specific integrated circuit (application-specific integrated circuit, ASIC), a programmable logic device (programmable logic device, PLD), or a combination thereof. The PLD may be a complex programmable logic device (complex programmable logic device, CPLD), a field-programmable gate array (field-programmable gate array, FPGA), a generic array logic (generic array logic, GAL), or any combination thereof.

The memory 1201 may include a volatile memory (volatile memory), for example, a random-access memory (random-access memory, RAM). The memory 1201 may also include a non-volatile memory (non-volatile memory), for example, a flash memory (flash memory), a hard disk drive (hard disk drive, HDD), or a solid-state drive (solid-state drive, SSD). The memory 1201 may further include a combination of the foregoing types of memories.

Figure 13:
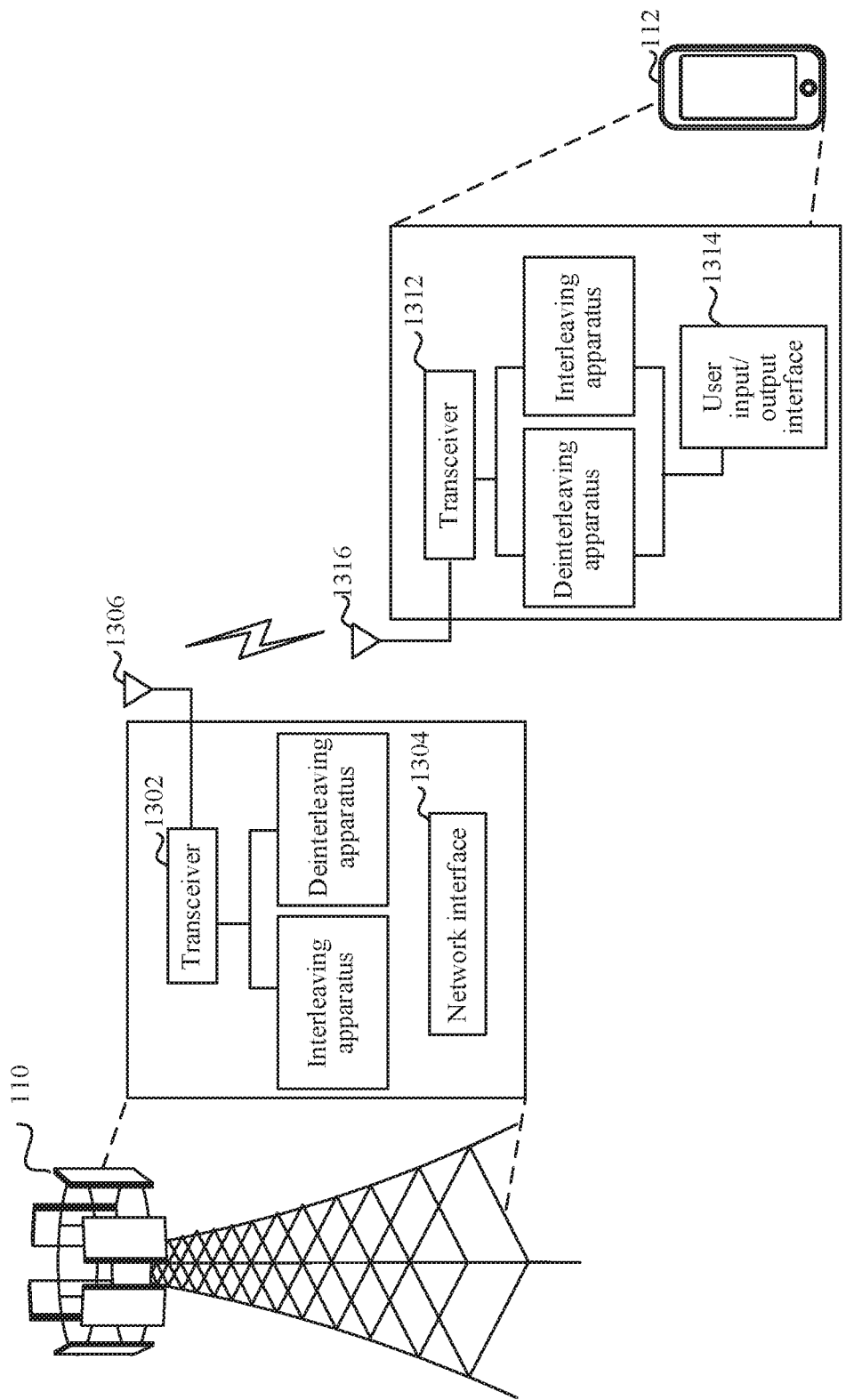
FIG. 13 is a schematic structural diagram of a network device and a terminal according to an embodiment of this application.

An embodiment of this application further provides a network device. Referring to FIG. 13, the foregoing interleaving apparatus and/or deinterleaving apparatus may be mounted in a network device 110. In addition to the foregoing interleaving apparatus and deinterleaving apparatus, the network device 110 may further include a transceiver 1302. A bit sequence interleaved by the interleaving apparatus is sent to a terminal 112 by using the transceiver 1302 after subsequent changing or processing. Alternatively, the transceiver 1302 is further configured to receive information/data from the terminal 112. The information/data is converted into a to-be-deinterleaved sequence through a series of processing, and a deinterleaved sequence is obtained through processing of the deinterleaving apparatus. The network device 110 may further include a network interface 1304, configured to communicate with another network device.

Similarly, the foregoing interleaving apparatus and/or deinterleaving apparatus may be mounted in a terminal 112 In addition to the foregoing interleaving apparatus and deinterleaving apparatus, the terminal 112 may further include a transceiver 1312. A bit sequence interleaved by the interleaving apparatus is sent to the network device 110 by using the transceiver 1312 after subsequent changing or processing. Alternatively, the transceiver 1312 is further configured to receive information/data from the network device 110. The information/data is converted into a to-be-deinterleaved sequence through a series of processing, and a deinterleaved sequence is obtained through processing of the deinterleaving apparatus. The terminal 112 may further include a user input/output interface 1314, configured to receive information entered by a user. Information that needs to be sent to the network device 110 needs to be processed by an interleaver and then sent to the network device 110 by using the transceiver 1312. Data deinterleaved by a deinterleaver may also be presented. to the user by using the input/output interface 1314 after subsequent processing.

An embodiment of this application further provides a computer storage medium, storing a computer program. The computer program includes an instruction used to perform the interleaving method shown in FIG. 3 and the deinterleaving method provided in the foregoing embodiment.

An embodiment of this application further provides a polar code encoding apparatus, including any one of the interleaving apparatuses in FIG. 7 to FIG. 9 and any one of the deinterleaving apparatuses in FIG. 10 to FIG. 12.

An embodiment of this application further provides a computer program product including an instruction. When the computer program product is run on a computer, the computer is enabled to perform the interleaving method shown in FIG. 3 and the deinterleaving method provided in the foregoing embodiment.

Persons skilled in the art should understand that the embodiments of this application may be provided as a method, a system, or a computer program product. Therefore, this application may use a form of hardware only embodiments, software only embodiments, or embodiments with a combination of software and hardware. In addition, this application may use a form of a computer program product that is implemented on one or more computer-usable storage media (including but not limited to a magnetic disk memory, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a special-purpose computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although preferred embodiments of this application have been described, persons skilled in the art can make changes and modifications to these embodiments Once they leant of the basic inventive concept. Therefore, the following claims are intended to be construed as to cover the preferred embodiments and all changes and modifications falling within the scope of this application.

Apparently, persons skilled in the art can make various modifications and variations to the embodiments of this application without departing from the spirit and scope of the embodiments of this application. This application is intended to cover these modifications and variations of the embodiments of this application provided that they fall within the scope of the claims of this application and their equivalent technologies.

What is claimed is:
1. An interleaving method, comprising:
obtaining, by a first device, a to-be-interleaved bit sequence for a second device, wherein the to-be-interleaved bit sequence comprises L subsequences, the L subsequences comprise at least a first subsequence group and a second subsequence group, the first subsequence group comprises at least two subsequences, the second subsequence group comprises at least one subsequence, and L is a positive integer greater than 1, wherein the first and the second subsequence groups are generated using a modulo operation;
performing, by the first device, an interleaving operation on the to-be-interleaved bit sequence to generate an interleaved bit sequence, wherein the interleaving operation comprises:
interleaving the subsequences in the first subsequence group in a first interleaving manner, and
skipping interleaving the subsequence in the second subsequence group or interleaving the subsequence in the second subsequence group in a second interleaving manner that is different from the first interleaving manner, wherein the first interleaving manner is first row-column interleaving, the second interleaving manner is second row-column interleaving, and row quantities or column quantities of the first row-column interleaving and the second row-column interleaving are different; and after the interleaving operation, transmitting, by the first device and over a wireless communication channel to the second device, a signal comprising the interleaved bit sequence.

2. The method according to claim 1, wherein a result obtained by performing the modulo operation on a number of each subsequence in the first subsequence group based on a specified value is a first operation result; and
a result obtained by performing the modulo operation on a number of each subsequence in the second subsequence group based on the specified value is a second operation result.

3. The method according to claim 1, wherein the interleaving the subsequences in the first subsequence group in the first interleaving manner comprises:
inputting all bits in the first subsequence group into an interleaver one by one for row-column interleaving; or
performing row-column interleaving on each of at least some of the subsequences in the first subsequence group within the subsequence.

4. The method according to claim 1, wherein the interleaving the subsequences in the first subsequence group in the first interleaving manner comprises:
interleaving locations of the subsequences in the first subsequence group; and
inputting all bits in the first subsequence group into a row-column interleaver for row-column interleaving; or performing row-column interleaving on each subsequence in the first subsequence group within the subsequence.

5. The method according to claim 1, wherein after the obtaining the to-be-interleaved bit sequence, and before the interleaving operation, the method further comprises:
inputting the to-be-interleaved bit sequence into an i-row and j-column interleaver; and
if i=L, and one row of bits constitute one subsequence, reading the subsequences in the first subsequence group row by row, and reading the subsequences in the second subsequence group row by row; or if j=L, and one column of bits constitute one subsequence, reading the subsequences in the first subsequence group column by column, and reading the subsequences in the second subsequence group column by column.

6. The method according to claim 1, wherein after the obtaining the to-be-interleaved bit sequence, and before the interleaving operation, the method further comprises:
grouping the L subsequences, to obtain the first subsequence group and the second subsequence group.

7. The method according to claim 1, wherein a value of L is 31.

8. The method according to claim 1, wherein the method further comprises:
interleaving locations of the first subsequence group and the second subsequence group;
obtaining a to-be-deinterleaved sequence; and
performing a deinterleaving operation on the to-be-deinterleaved sequence in a deinterleaving manner, wherein the deinterleaving manner is determined based on the step of the obtaining the to-be-interleaved bit sequence and the interleaving operation.

9. An interleaving apparatus, comprising:
a memory; and
at least one hardware processor communicatively coupled with the memory and configured to:
obtain a to-be-interleaved bit sequence for another device, wherein the to-be-interleaved bit sequence comprises L subsequences, the L subsequences comprise at least a first subsequence group and a second subsequence group, the first subsequence group comprises at least two subsequences, the second subsequence group comprises at least one subsequence, and L is a positive integer greater than 1, wherein the first and the second subsequence groups are generated using a modulo operation;
perform an interleaving operation on the to-be-interleaved bit sequence to generate an interleaved bit sequence, wherein the interleaving operation comprises:
interleave, in a first interleaving manner, the subsequences in the first subsequence group, and
skip interleaving the subsequence in the second subsequence group or interleave the subsequence in the second subsequence group in a second interleaving manner that is different from the first interleaving manner, wherein the first interleaving manner is first row-column interleaving, the second interleaving manner is second row-column interleaving, and row quantities or column quantities of the first row-column interleaving and the second row-column interleaving are different; and
after the interleaving operation, transmit, over a wireless communication channel to the another device, a signal comprising the interleaved bit sequence.

10. The apparatus according to claim 9, wherein a result obtained by performing the modulo operation on a number of each subsequence in the first subsequence group based on a specified value is a first operation result; and
a result obtained by performing the modulo operation on a number of each subsequence in the second subsequence group based on the specified value is a second operation result.

11. The apparatus according to claim 9, wherein the at least one hardware processor is configured to:
input all bits in the first subsequence group into an interleaver one by one for row-column interleaving; or
perform row-column interleaving on each of at least some of the subsequences in the first subsequence group within the subsequence.

12. The apparatus according to claim 9, wherein at least one hardware processor is configured to:
interleave locations of the subsequences in the first subsequence group; and
input all bits in the first subsequence group into a row-column interleaver for row-column interleaving; or
perform row-column interleaving on each subsequence in the first subsequence group within the subsequence.

13. The apparatus according to claim 9, wherein the at least one hardware processor is further configured to: after obtaining the to-be-interleaved bit sequence, and before the interleaving operation, input the to-be-interleaved bit sequence into an i-row and j-column interleaver; and if i=L, and one row of bits constitute one subsequence, read the subsequences in the first subsequence group row by row, and read the subsequences in the second subsequence group row by row; or if j=L, and one column of bits constitute one subsequence, read the subsequences in the first subsequence group column by column, and read the subsequences in the second subsequence group column by column.

14. The apparatus according to claim 9, wherein the at least one hardware processor is further configured to: after obtaining the to-be-interleaved bit sequence, and before the interleaving operation, group the L subsequences, to obtain the first subsequence group and the second subsequence group.

15. The apparatus according to claim 9, wherein a value of L is 31.

16. The apparatus according to claim 9, wherein the at least one hardware processor is further configured to:
  interleave locations of the first subsequence group and the second subsequence group.

17. A non-transitory computer-readable medium storing computer instructions, that when executed by one or more hardware processors, cause a first device to perform operations comprising:
  obtaining a to-be-interleaved bit sequence for a second device, wherein the to-be-interleaved bit sequence comprises L subsequences, the L subsequences comprise at least a first subsequence group and a second subsequence group, the first subsequence group comprises at least two subsequences, the second subsequence group comprises at least one subsequence, and L is a positive integer greater than 1, wherein the first and the second subsequence groups are generated using a modulo operation;
  performing an interleaving operation on the to-be-interleaved bit sequence to generate an interleaved bit sequence, wherein the interleaving operation comprises:
    interleaving the subsequences in the first subsequence group in a first interleaving manner, and
    skipping interleaving the subsequence in the second subsequence group or interleaving the subsequence in the second subsequence group in a second interleaving manner that is different from the first interleaving manner, wherein the first interleaving manner is first row-column interleaving, the second interleaving manner is second row-column interleaving, and row quantities or column quantities of the first row-column interleaving and the second row-column interleaving are different; and
  after the interleaving operation, transmitting, over a wireless communication channel to the second device, a signal comprising the interleaved bit sequence.

18. The non-transitory computer-readable medium according to claim 17, wherein a result obtained by performing the modulo operation on a number of each subsequence in the first subsequence group based on a specified value is a first operation result; and
  a result obtained by performing the modulo operation on a number of each subsequence in the second subsequence group based on the specified value is a second operation result.

* * * * *